United States Patent
Eto

(10) Patent No.: US 7,203,115 B2
(45) Date of Patent: Apr. 10, 2007

(54) SEMICONDUCTOR MEMORY AND METHOD FOR OPERATING THE SAME

(75) Inventor: Satoshi Eto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 56 days.

(21) Appl. No.: 11/265,229

(22) Filed: Nov. 3, 2005

(65) Prior Publication Data

US 2006/0056258 A1 Mar. 16, 2006

Related U.S. Application Data

(63) Continuation of application No. PCT/JP03/10412, filed on Aug. 18, 2003.

(51) Int. Cl.
*G11C 7/00* (2006.01)

(52) U.S. Cl. .................... 365/222; 365/230.03

(58) Field of Classification Search ............ 365/222, 365/230.03; 714/800
See application file for complete search history.

(56) References Cited

U.S. PATENT DOCUMENTS

| | | | |
|---|---|---|---|
| 4,766,573 A | 8/1988 | Takemae | |
| 6,683,817 B2 * | 1/2004 | Wei et al. ............. | 365/230.03 |
| 6,957,378 B2 * | 10/2005 | Koga et al. ............. | 714/763 |
| 2002/0018389 A1 | 2/2002 | Ito et al. | |
| 2002/0067649 A1 | 6/2002 | Kitamoto et al. | |
| 2002/0145934 A1 | 10/2002 | Uchida et al. | |
| 2002/0156967 A1 | 10/2002 | Okuda | |
| 2002/0184592 A1 | 12/2002 | Koga et al. | |
| 2003/0007410 A1 | 1/2003 | Okuda et al. | |
| 2003/0026161 A1 | 2/2003 | Yamaguchi et al. | |
| 2003/0156454 A1 * | 8/2003 | Wei et al. ............. | 365/185.17 |
| 2004/0008562 A1 | 1/2004 | Ito et al. | |

FOREIGN PATENT DOCUMENTS

| | | |
|---|---|---|
| JP | 05-041084 | 2/1993 |
| JP | 2003-059290 | 2/2003 |

* cited by examiner

*Primary Examiner*—Vu A. Le
(74) *Attorney, Agent, or Firm*—Arent Fox, PLLC.

(57) ABSTRACT

A data additional circuit adds plural types of expectation data to be read from a refresh block to data read from other blocks, respectively, to generate plural read data strings. An error correction circuit detects errors for each read data string, and sets the most reliable result of the error detection results to be true. The error correction circuit decodes data to be read from the refresh block based on a true error detection result. Moreover, the error correction circuit corrects the error of the read data string corresponding to the true error detection result. Consequently, without extending the read cycle time, a refresh operation can be hid, and errors can be corrected simultaneously. By correcting a data error read from a bad memory cell of data retention characteristics, a refresh request interval can be extended, and power consumption during a standby period can be reduced.

48 Claims, 23 Drawing Sheets

|  | C1 | 0 | 0 | 1 | 1 |
|--|----|---|---|---|---|
|  | C0 | 0 | 1 | 0 | 1 |
| | | MBD0 | MBD1 | MBD2 | MBD3 |
| | | MBD4 | MBD5 | MBD6 | MBD7 |
| | | MBD8 | MBD9 | MBD10 | MBD11 |
| | | MBD12 | MBD13 | MBD14 | MBD15 |

L1 L0
0 0
0 1
1 0
1 1

⇨ generate parity       "+" indicates EXOR

LP0(MBE0)=MBD0+MBD1+MBD2+MBD3+MBD8+MBD9+MBD10+MBD11
LP1(MBE1)=MBD4+MBD5+MBD6+MBD7+MBD12+MBD13+MBD14+MBD15
LP2(MBE2)=MBD0+MBD1+MBD2+MBD3+MBD4+MBD5+MBD6+MBD7
LP3(MBE3)=MBD8+MBD9+MBD10+MBD11+MBD12+MBD13+MBD14+MBD15

CP0(MBE4)=MBD0+MBD4+MBD8+MBD12+MBD2+MBD6+MBD10+MBD14
CP1(MBE5)=MBD1+MBD5+MBD9+MBD13+MBD3+MBD7+MBD11+MBD15
CP2(MBE6)=MBD0+MBD4+MBD8+MBD12+MBD1+MBD5+MBD9+MBD13
CP3(MBE7)=MBD2+MBD6+MBD10+MBD14+MBD3+MBD7+MBD11+MBD15

Fig. 7

| block in refresh | data is read from block in refresh | | no error : b'1000, ECC error : b'0100, single-bit error : b'0010, two-or-more-bit error : b'0001 | |
|---|---|---|---|---|
| data block | 0 | res0 | no error | ECC error |
| | | | (a) ............ single-bit error | (c) ............ two-or-more-bit error |
| | | res1 | single-bit error | two-or-more-bit error |
| | 1 | res0 | single-bit error | two-or-more-bit error |
| | | | (d) ............ no error | (f) ............ ECC error |
| | | res1 | no error | ECC error |
| code block | 0 | res0 | no error | ECC error |
| | | | (g) ............ ECC error | (i) ............ two-or-more-bit error |
| | | res1 | ECC error | two-or-more-bit error |
| | 1 | res0 | ECC error | two-or-more-bit error |
| | | | (j) ............ no error | (l) ............ ECC error |
| | | res1 | no error | single-bit error |
| error decision | | | no error | single-bit error in data block | single-bit error in ECC block | priority of error decision : coincidence>ECC error>single-bit error> two-or-more-bit error

```
module ECC(syndrome,code,ccode,dout,errflg_2b)      ;
      input[5:0]           syndrome            ; // input syndrome
      input[21:0]          code                ; // input code
      output[21:0]         ccode               ; // corrected code
      output[15:0]         dout                ; // output information data
      output               errflg_2b           ; // detection flag of two-or-more-bit error
      wire[21:0]           errpoint            ; // error pointer assign errflg_2b    = |syndrome[4:0] & ~syndrome[5]  ; // flag logic of two-or-more-bit error
assign errpoint     = dec_erradd(syndrome)   ; // determine error location from syndrome
assign ccode        = code ^ errpoint         ; // error correction
assign dout         =
      {ccode[20:16],ccode[14:8],ccode[6:4],ccode[2]}  ; // extract information data from code function[21:0]    dec_erradd              ; // function to determine error location
input [5:0]    syndrome                   ; // set "1" in bit of error location
begin                                     ; // return all "0" case(syndrome)
                                          ; // in case of no error or two-or-more-bit error
6'b100001 : dec_erradd = 22'b0000000000000000000001   ; //
6'b100010 : dec_erradd = 22'b0000000000000000000010   ;
6'b100011 : dec_erradd = 22'b0000000000000000000100   ;
6'b100100 : dec_erradd = 22'b0000000000000000001000   ;
6'b100101 : dec_erradd = 22'b0000000000000000010000   ;
6'b100110 : dec_erradd = 22'b0000000000000000100000   ;
6'b100111 : dec_erradd = 22'b0000000000000001000000   ;
6'b101000 : dec_erradd = 22'b0000000000000010000000   ;
6'b101001 : dec_erradd = 22'b0000000000000100000000   ;
6'b101010 : dec_erradd = 22'b0000000000001000000000   ;
6'b101011 : dec_erradd = 22'b0000000000010000000000   ;
6'b101100 : dec_erradd = 22'b0000000000100000000000   ;
6'b101101 : dec_erradd = 22'b0000000001000000000000   ;
6'b101110 : dec_erradd = 22'b0000000010000000000000   ;
6'b101111 : dec_erradd = 22'b0000000100000000000000   ;
6'b110000 : dec_erradd = 22'b0000001000000000000000   ;
6'b110001 : dec_erradd = 22'b0000010000000000000000   ;
6'b110010 : dec_erradd = 22'b0000100000000000000000   ;
6'b110011 : dec_erradd = 22'b0001000000000000000000   ;
6'b110100 : dec_erradd = 22'b0010000000000000000000   ;
6'b110101 : dec_erradd = 22'b0100000000000000000000   ;
6'b100000 : dec_erradd = 22'b1000000000000000000000   ;
default   : dec_erradd = 22'b0000000000000000000000   ; //Case @ 0 or 2 bit Error
endcase
end
endfunction
endmodule
```

Fig. 14

```
module synd(code,syndrome)                    ;
       input[21:0]   code                     ;//read code
       output[5:0]   syndrome                 ;//syndrome
       wire[21:0]    c                        ;

assign c        = code                        ;

// syndrome operation assign syndrome[0] = ^{c[0],c[2],c[4],c[6],c[8],c[10],c[12],c[14],c[16],c[18],c[20]}  ;
assign syndrome[1] = ^{c[1],c[2],c[5],c[6],c[9],c[10],c[13],c[14],c[17],c[18]}        ;
assign syndrome[2] = ^{c[3],c[4],c[5],c[6],c[11],c[12],c[13],c[14],c[19],c[20]}       ;
assign syndrome[3] = ^c[14:7]                                                         ;
assign syndrome[4] = ^c[20:15]                                                        ;
assign syndrome[5] = ^c                                                               ;

endmodule
```

Fig. 16

```
module Hamming(data,code)                     ;
       input[15:0]   data                     ; // information bit
       output[21:0]  code                     ; // extracted Hamming code
       wire[15:0]    d                        ;

assign d         = data                       ;
assign code[2]   = d[0]                       ;
assign code[6:4] = d[3:1]                     ;
assign code[14:8] = d[10:4]                   ;
assign code[20:16] = d[15:11]                 ;

// <<<<< generating logic of extracted Hamming code >>>>> assign code[0]   =^{d[0],d[1],d[3],d[4],d[6],d[8],d[10],d[11],d[13],d[15]}  ;
assign code[1]   =^{d[0],d[2],d[3],d[5],d[6],d[9],d[10],d[12],d[13]}        ;
assign code[3]   =^{d[1],d[2],d[3],d[7],d[8],d[9],d[10],d[14],d[15]}        ;
assign code[7]   =^d[10:4]                                                  ;
assign code[15]       =^d[15:11]                                            ;
assign code[21]       =^code[20:0]                                          ;

endmodule
```

Fig. 17

Fig. 18 write data (expected value)

| block address | P0 E1 | P1 E2 | P2 E4 | D0 E3 | D1 E5 | D2 E6 | D3 E7 | P3 E8 | D4 E9 | D5 E10 | D6 E11 | D7 E12 | D8 E13 | D9 E14 | D10 E15 | P4 E16 | D11 E17 | S12 E18 | D13 E19 | D14 E20 | D15 E21 | P5 E22 |
|---|---|---|---|---|---|---|---|---|---|---|---|---|---|---|---|---|---|---|---|---|---|---|
| wdat | 0 | 1 | 0 | 0 | 0 | 1 | 0 | 1 | 1 | 1 | 1 | 0 | 0 | 0 | 0 | 0 | 1 | 0 | 0 | 0 | 1 | 0 | read data

| block address | P0 E1 | P1 E2 | P2 E4 | D0 E3 | D1 E5 | D2 E6 | D3 E7 | P3 E8 | D4 E9 | D5 E10 | D6 E11 | D7 E12 | D8 E13 | D9 E14 | D10 E15 | P4 E16 | D11 E17 | S12 E18 | D13 E19 | D14 E20 | D15 E21 | P5 E22 |
|---|---|---|---|---|---|---|---|---|---|---|---|---|---|---|---|---|---|---|---|---|---|---|
| rdat | 0 | 1 | 0 | 0 | 0 | 1 | 0 | 1 | 1 | 1 | 1 | 0 | 0 | 0 | 1 | 0 | 1 | 0 | 0 | 0 | 1 | 0 | error-correct data from refresh block as "0"

| block address | P0 E1 | P1 E2 | P2 E4 | D0 E3 | D1 E5 | D2 E6 | D3 E7 | P3 E8 | D4 E9 | D5 E10 | D6 E11 | D7 E12 | D8 E13 | D9 E14 | D10 E15 | P4 E16 | D11 E17 | S12 E18 | D13 E19 | D14 E20 | D15 E21 | P5 E22 |
|---|---|---|---|---|---|---|---|---|---|---|---|---|---|---|---|---|---|---|---|---|---|---|
| code0 | 0 | 1 | 0 | 0 | 0 | 1 | 0 | 1 | 1 | 1 | 1 | 0 | 0 | 0 | 0 | 0 | 1 | 0 | 0 | 0 | 1 | 0 |

⇒ syn0: S5=0 S4=0 S3=0 S2=0 S1=0 S0=0 ⇧ no error ("1000")

error-correct data from refresh block as "1"

| block address | P0 E1 | P1 E2 | P2 E4 | D0 E3 | D1 E5 | D2 E6 | D3 E7 | P3 E8 | D4 E9 | D5 E10 | D6 E11 | D7 E12 | D8 E13 | D9 E14 | D10 E15 | P4 E16 | D11 E17 | S12 E18 | D13 E19 | D14 E20 | D15 E21 | P5 E22 |
|---|---|---|---|---|---|---|---|---|---|---|---|---|---|---|---|---|---|---|---|---|---|---|
| code1 | 0 | 1 | 0 | 0 | 0 | 1 | 0 | 1 | 1 | 1 | 1 | 0 | 0 | 0 | 1 | 0 | 1 | 0 | 0 | 0 | 1 | 0 |

⇒ syn1: S5=1 S4=0 S3=1 S2=1 S1=1 S0=1 ⇧ single-bit error ("0010") correction address = E15

Fig. 19

SEMICONDUCTOR MEMORY AND METHOD FOR OPERATING THE SAME

CROSS REFERENCE TO RELATED APPLICATION

This application is a continuation application of International Application No. PCT/JP03/10412, filed Aug. 18, 2003, and designating the U.S.

BACKGROUND OF THE INVENTION

1. Field of the Invention

The present invention relates to a semiconductor memory having dynamic memory cells that require a refresh operation and a method for operating the same.

2. Description of the Related Art

Recently, a semiconductor memory referred to as a pseudo SRAM has been drawing attention. The pseudo SRAM has DRAM memory cells, operating as an SRAM that automatically executes an internal refresh operation of the memory cells. Because the dynamic memory cell has a small size, the bit cost is low, and accordingly, it is possible to develop the pseudo SRAM having a large capacity.

However, since the pseudo SRAM stores data with charges accumulated in a capacitor of the memory cell, data might be lost due to charge leakage and so on. To avoid this, the pseudo SRAM is required to perform a refresh operation for each predetermined period. The refresh operation reads out data stored in the memory cell to a bit line, amplifies the data on the bit line, and rewrites the data into the memory cell.

A refresh request for performing the refresh operation is generated regardless of an external access request. For this reason, the refresh operation may conflict with an access operation. The pseudo SRAM is required to hide the refresh operation against an external system even when the conflict occurs, in order to have an SRAM interface. Recently, in order to hide the refresh operation, a semiconductor memory has been proposed in which an error correction code as well as write data is stored (e.g., see Japanese Unexamined Patent Application Publication No. 2003-51186). The semiconductor memory uses the error correction code to regenerate read data without reading out data from a memory block under the refresh operation. In addition, a read request does not conflict with a refresh request, so that it is not necessary that the refresh operation time be included in a read cycle time. As a result, the read cycle time can be equivalent to that of the SRAM.

Further, since the pseudo SRAM requires the refresh operation, its power consumption during a standby period is large, as compared with an SRAM whose memory cell includes a latch. The power consumed during the standby period has a DC component and an AC component. The DC component, which is a leak component, refers to an off-current of the transistor and a current intentionally being flowed due to the existence of an internal circuit (in particular, power supply circuit). In addition to this, the DC component depends on how the semiconductor is processed and how the circuit is constructed, so it is beyond dispute that there is a difference between a pseudo SRAM and an SRAM.

The AC component of the current consumed during the standby period of the pseudo SRAM is mainly a current from the refresh operation. For this reason, a reduction of the refresh operation current is effective for reducing the AC component. Recently, in order to reduce the refresh operation current, a semiconductor memory has been proposed in which write data together with an error correction code are stored. The semiconductor memory substantially improves data retention characteristics of the memory cell with the error correction code, and extends a refresh interval to thus reduce the refresh operation current (e.g., see Japanese Unexamined Patent Application Publication No. 5-41084, Japanese Unexamined Patent Application Publication No. 2002-56671, and Japanese Unexamined Patent Application Publication No. 2003-59290).

However, in the error correction method used in the above-mentioned conventional pseudo SRAM, it is possible to perform only either reduction of a read cycle time or reduction of a standby current. Specifically, the read cycle time (AC characteristics) may be equivalent to the SRAM, while the standby current (DC characteristics) may not be equivalent to the SRAM. Alternatively, the standby current may be equivalent to the SRAM, while the read cycle time may not be equivalent to the SRAM. In other words, the pseudo SRAM being completely compatible to the SRAM is not realized yet. As a result, it is difficult to operate the system in the manner where the SRAM embedded in the system may be simply replaced with the pseudo SRAM, for example, for the sake of cost reduction.

SUMMARY OF THE INVENTION

Accordingly, it is an object of the invention to provide a pseudo SRAM capable of hiding a refresh operation without extending an access cycle time and capable of reducing power consumption during a standby period.

It is another object of the invention to provide a pseudo SRAM that is fully compatible with an SRAM.

According to an aspect of a semiconductor memory of the invention, a plurality of data blocks has memory cells to store information data. A plurality of code blocks has memory cells which store code data to decode data stored in the data blocks. A refresh control circuit outputs refresh request signals to sequentially perform refresh operations on the data blocks and the code blocks. A data additional circuit adds a plurality of types of expectation data to be read out from a refresh block to data read out from other blocks, respectively, to thus generate a plurality of read data strings. Here, the refresh block is a block, of the data blocks and the code blocks, unable to be read out by the refresh operation.

An error correction circuit detects errors for the read data strings and sets the most reliable result of the error detection results to be true. Further, the error correction circuit corrects an error of one of the read data strings corresponding to the true error detection result. The code data is, for example, a horizontal/vertical parity code or an extracted Hamming code, and a minimum Hamming distance of the code data is four or more.

As such, by comparing error detection results of a plurality of read data strings that expect a part of data to thus detect a true error, and by correcting an error actually generated at one of the blocks based on the true error, it is possible to hide a refresh operation against an external system and to accomplish an error correction at the same time. In addition, it is possible to hide a refresh operation without conflicting with a request to read, such that it is possible to prevent a read cycle time from being lengthened (improvements in AC characteristics).

With an error correction function, it is possible to correct an error generated by, for example, a memory cell having a short data retention time, or a minimum time capable of holding data. For this reason, it is possible to extend a refresh request interval and to reduce power consumption during a standby period (improvements in DC characteristics). Specifically, even when the refresh interval of each memory cell is set to be longer than the data retention time of the worst memory cell, the wrong data will never be read. Therefore, when the invention is applied to, for example, a pseudo SRAM, both the AC and DC characteristics can be equivalent to an SRAM. In other words, it is possible to provide a user with a pseudo SRAM that is fully compatible to an SRAM. The user can reduce costs only by changing an SRAM embedded in the system into the pseudo SRAM applied by the invention.

According to another aspect of a semiconductor memory of the invention, the refresh control circuit sequentially outputs the refresh request signals to the data blocks and the code blocks to perform the refresh operation on any of the data blocks and the code blocks. By performing the refresh operation that responds to the refresh request only in one block, it is possible to easily recover data that cannot be read out by the refresh operation.

According to another aspect of a semiconductor memory of the invention, an access control circuit outputs a read request signal to read the data blocks and the code blocks other than the refresh block, in response to a read command. In other words, the refresh block does not perform the read operation. For this reason, it is possible to prevent conflict between the refresh request and the read request, and to prevent a read access time from increasing. In addition, it is possible to easily control a read operation with the access control circuit.

According to another aspect of a semiconductor memory of the invention, an access control circuit outputs a write request signal to write to the data blocks and the code blocks, in response to a write command. Each block control circuit of the data blocks and the code blocks performs the refresh operations and then performs a write operation, when the refresh request signals and the write request signal conflict with each other. For this reason, it is ensured that the write data can be written to the refresh block.

According to another aspect of a semiconductor memory of the invention, an external write cycle time that is the minimum supply interval of the write command may be set to be longer than an internal write cycle time that is the write operation time of each block. For this reason, the block control circuit can gradually recover the delay of the write operation, even when the refresh request is generated between the write request signals consecutively supplied. In other words, it is ensured that the write data can be written to the refresh block.

According to another aspect of a semiconductor memory of the invention, for a switching period which is a period to switch from a final refresh request signal of one refresh block to the next refresh block, n times of the external write cycle time can be inserted, and once of the refresh operations and n times of the write operation can be performed. For example, the switching period may be set to be at least $(Tcyc/\delta) \times Tcyc$, when $\delta$ is a difference between the external write cycle time Tcyc and the internal write cycle time. For this reason, a delayed write operation due to a refresh request for a certain block is completed within the refresh block period of the block. After switching to a general block from the refresh block, there is no unfinished write operation corresponding to the write request supplied during the refresh block. For this reason, for blocks other than the refresh block, it is possible to prevent the read operation from being delayed depending on the conflict between the refresh operation and the write operation, and to prevent the read access time from being lengthened.

According to another aspect of a semiconductor memory of the invention, the code blocks are formed instead of at least one of a row redundancy circuit and a column redundancy circuit that eliminates the defects. Erroneous data read from the defect memory cell can be corrected with the error correction circuit. Since it is not necessary to form the redundancy circuit, it is possible to reduce the chip size.

According to another aspect of a semiconductor memory of the invention, the error correction circuit selects as true a read data string having few errors out of the read data strings. For example, the error correction circuit detects one of "no error", "single-bit error in any of the data blocks", "single-bit error in any of the code blocks (code error)", and "two-or-more-bit error", and prioritizes the error decision of no error>single-bit error>code error>two-or-more-bit error. In addition, the error correction circuit sets an item having a higher priority to be true. For this reason, the error decision logic of the error correction circuit can be easily provided.

According to another aspect of a semiconductor memory of the invention, when the error correction circuit detects an error that cannot be corrected, the error correction circuit outputs an error signal to an error terminal. For example, when "two-or-more-bit error" is detected, the error correction circuit outputs an error signal. With the error signal, an external system accessing the semiconductor memory can perform operation to avoid errors, such as requesting to retry the read operation, and deleting data. As a result, the reliability of the system can be enhanced.

According to another aspect of a semiconductor memory of the invention, a rewrite control circuit may rewrite data corrected by the error correction circuit in the data blocks and the code blocks. When data in the memory cell is corrupted by power noise, soft error, and such, by writing correct data, the reliability of the semiconductor memory can be enhanced.

According to another aspect of a semiconductor memory of the invention, the data blocks are formed, respectively, corresponding to a plurality of data terminals which input and output information data. For this reason, errors can be corrected in units of data that is input and output to the semiconductor memory at once. As a result, it is possible to simplify the logic of the error correction of the read data and to easily generate the code data, and thus, it is possible to prevent a read cycle time and a write cycle time from increasing.

According to another aspect of a semiconductor memory of the invention, the write data supplied at once to the plurality of the data terminals which input and output information data is written to a part of the data blocks. During the write operation, the error correction circuit decodes information data by using the read data from the data blocks and the code blocks, and generates a data string by replacing a part of the decoded information data with the write data. The error correction circuit determines new code data from the rewrite data string, and writes the rewrite data string and the new code data into the data blocks and the code blocks. By increasing the number of bits of information data, it is possible to relatively reduce the number of bits of code data with respect to the number of bits of information data. As a result, it is possible to relatively reduce the number of code blocks with respect to the number of data blocks, and to reduce the chip size.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 7 is an illustrative diagram of a parity code generation rule according to the first embodiment of the invention;

FIG. 9 is an illustrative diagram of an overview of an operation of an error correction circuit shown in FIG. 2;

FIG. 10 is a timing diagram of an example of a read operation according to the first embodiment of the invention;

FIG. 14 is an illustrative diagram of an RTL description of an error correction circuit shown in FIG. 13;

FIG. 16 is an illustrative diagram of the RTL description of a syndrome generation circuit shown in FIG. 13;

FIG. 17 is an illustrative diagram of the RTL description of a coding circuit shown in FIG. 13;

FIG. 18 is an illustrative diagram of an error correction operation of a data control circuit shown in FIG. 12;

FIG. 19 is an illustrative diagram of another error correction operation of a data control circuit shown in FIG. 12;

DESCRIPTION OF THE PREFERRED EMBODIMENTS

Figure 1:
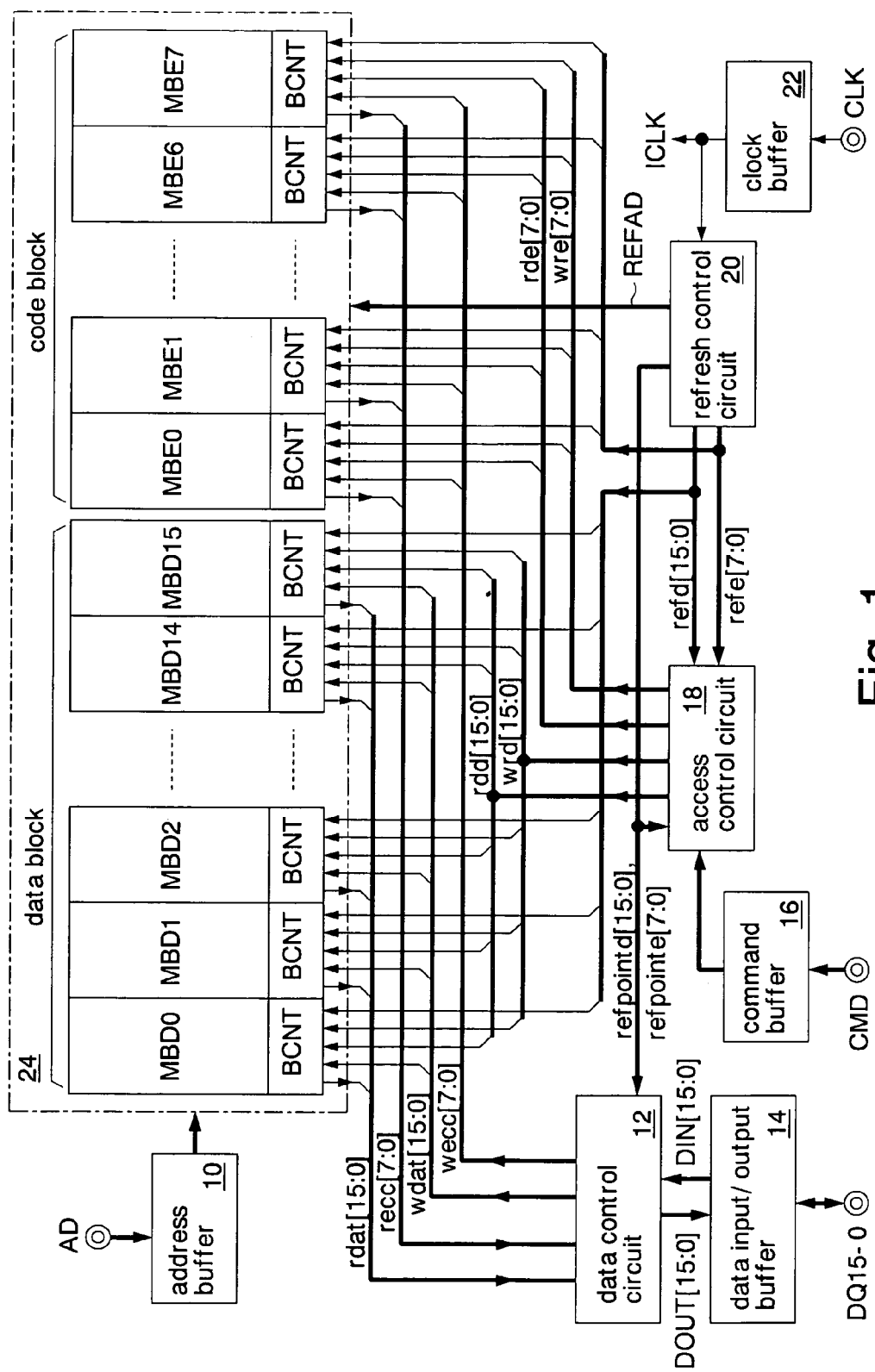
FIG. 1 is a block diagram according to a first embodiment of the invention.

Embodiments of the invention will now be described with reference to the accompanying drawings. In the drawings, a double circle refers to an external terminal. In the drawings, a signal line indicated by a bold line includes a plurality of bodies. A part of a block to which the bold line is connected includes a plurality of circuits. For a signal supplied through the external terminal, a code identical to the terminal name is used. For a signal line to which the signal is transferred, a code identical to the signal name is used. The "z" suffixed to the end of the signal name refers to a positive logic.

FIG. 1 shows a semiconductor memory according to a first embodiment of the invention. The semiconductor memory is formed on a silicon substrate as a synchronous pseudo SRAM in a clock synchronous type using a CMOS process.

The pseudo SRAM has an address buffer 10, a data control circuit 12, a data input/output buffer 14, a command buffer 16, an access control circuit 18, a refresh control circuit 20, a clock buffer 22, and a memory core 24.

The memory core 24 has data blocks MBD0-15, code blocks MBE0-7, and a block control circuit BCNT. The data blocks MBD0-15 are formed corresponding to data terminals DQ15-0, respectively, and hold information data (hereinafter, also simply referred to as data) supplied through the data terminals DQ15-0, respectively. The code blocks MBE0-7 hold each bit of an error correction code in 8 bits generated by the data retained in the data blocks MBD0-15, respectively. The error correction code is used as code data for decoding information data stored in the data blocks. In addition, although not specifically shown, the memory core 24 has a row redundancy circuit for relieving defects in a word line unit and a column redundancy circuit for relieving defects in a bit line unit.

The block control circuits BCNT are formed corresponding to the blocks MBD0-15, and MBE0-7, respectively, and control operations of these blocks. When a write request signal and a refresh request signal (any of refd [15:0] and refe [7:0]) are received at the same time, the block control circuit BCNT sequentially outputs the corresponding write request signal (any of wrd [15:0] and wde [7:0]) only during a period when the refresh operation is inserted.

The data blocks MBD0-15 and the code blocks MBE0-7 have the same arrangement as each other, and have the same memory capacity. Each of blocks MBD0-15 and MBE0-7 have dynamic memory cells and word lines and bit lines connected to the dynamic memory cell. The memory cell has a capacitor that holds a data logic value as a charge and a transfer transistor that connects the capacitor to the bit line. The gate of the transfer transistor is connected to the word line. In addition, according to the present embodiment, as shown in FIG. 7 described below, a horizontal/vertical parity is used as an error correction code.

The address buffer 10 receives an address signal AD through an address terminal AD. The pseudo SRAM uses an address non-multiplex type with which the row address signal and the column address signal are received at one time. The row address signal is used to select the word line, among each of the blocks MBD0-15 and MBE0-7. The column address signal is used to select the bit line, among each of the blocks MBD0-15 and MBE0-7.

The clock buffer 22 receives a clock signal CLK through a clock terminal CLK, and outputs the received signal as an internal clock signal ICLK. The clock signal CLK is, for example, a system lock of a system board on which the pseudo SRAM is mounted. The internal clock signal ICLK is supplied to a circuit requiring a synchronous clock in the pseudo SRAM.

Although not specifically shown, the refresh control circuit 20 has a timer, a counter, a shift register, and a refresh request generation circuit. The timer operates in synchronization with the internal clock signal ICLK, and generates a periodic signal (pulse signal). The period of the timer is identical to a generation gap of the refresh request. The counter operates counting in synchronization with the periodic signal from the timer, and generates a refresh address signal REFAD. The refresh address signal REFAD is output to select the word line during the refresh operation. The number of bits of the counter is set to a number that all word lines in the blocks MBD0-15 and MBE0-7 are selected, when the counter goes round.

A shift register has twenty-four latches connected in cascade, and an output of the latch at a final stage is fed back to an input of the latch at an initial stage. During the power-on-reset, one latch is set to a high level and the other latches are set to low levels. The shift register shifts for each overflow of the counter, and outputs from the latches refresh point signals refpointd [15:0], refpointe [7:0], respectively, to indicate the blocks MBD0-15 and MBE0-7 that operate a refresh operation. In other words, the shift register sequentially activates the refresh point signals refpointd [15:0] and refpointe [7:0] one by one. For this reason, only one of the blocks MBD0-15 and MBE0-7 sequentially operates as a refresh block to perform the refresh operation. The refresh request generation circuit synchronizes with the periodic signal during an activation period of the refresh point signals refpointd [15:0] and refpointe [7:0], and outputs refresh request signals refd [15:0] and refe [7:0] that correspond to the refresh point signals refpointd [15:0] and refpointe [7:0], respectively.

The command buffer 16 receives a command signal CMD through a command terminal CMD, and outputs the received command signal CMD to the access control circuit 18. The command signal CMD is a signal to control an operation of the pseudo SRAM, such as, for example, a chip enable signal/CE, an output enable signal/OE and a write enable signal/WE. As a command supplied through the command terminal CMD, a write command for performing a write operation and a read command for performing a read operation are provided.

The access control circuit 18 decodes the command signal CMD, and outputs read request signals rdd [15:0] and rde [7:0] for performing the read operation, and write request signals wrd [15:0] and wde [7:0], depending on a decoding result. However, the access control circuit 18 masks outputs of the corresponding read request signals (any of rdd [15:0] and rde [7:0]) in response to activation of any of the refresh point signals refpointd [15:0] and refpointe [7:0]. In other words, the read operation is prohibited at the refresh block, and is performed at the other blocks. The read operation of the refresh block is always prohibited, so that a read control of the access control circuit 18 can be simply performed.

The data input/output buffer 14 outputs the data signals received through the data terminals DQ15-0 as input data DIN [15:0] during the write operation, and outputs output data DOUT [15:0] supplied from the data control circuit 12 to the data terminals DQ15-0 during the read operation.

The data control circuit 12 outputs the input data DIN [15:0] during the write operation as write data wdat [15:0] to the memory core 24, and at the same time, outputs an error correction code (write code data) wecc [7:0] generated from the input data DIN [15:0] to the memory core 24. In addition, the data control circuit 12 receives read data rdat [15:0] and an error correction code (read code data) recc [7:0] read from the memory core 24, during the read operation, and decodes one bit of data to be read out (but will not be read out) from the refresh block. At the same time, the data control circuit 12 decodes the read data (1 bit) from the memory cell having poor data retention characteristics in which data is lost. The error corrected read data is output as output data DOUT [15:0].

In addition, the bit numbers of the write request signal wrd [15:0], the read request signal rdd [15:0], the refresh point signal refpointd [15:0], the refresh request signal refd [15:0], the write data wdat [15:0], the read data rdat [15:0], the input data DIN [15:0] and the output data DOUT [15:0] correspond to the block numbers of the data blocks MBD15-0, respectively. In the same manner, the bit numbers of the write request signals wde [7:0], the read request signals rde [7:0], the refresh point signal refpointe [7:0], the refresh request signal refe [7:0], the error correction code wecc [7:0] and the error correction code recc [7:0] correspond to the block numbers of the code blocks MBE7-0, respectively.

Figure 2:
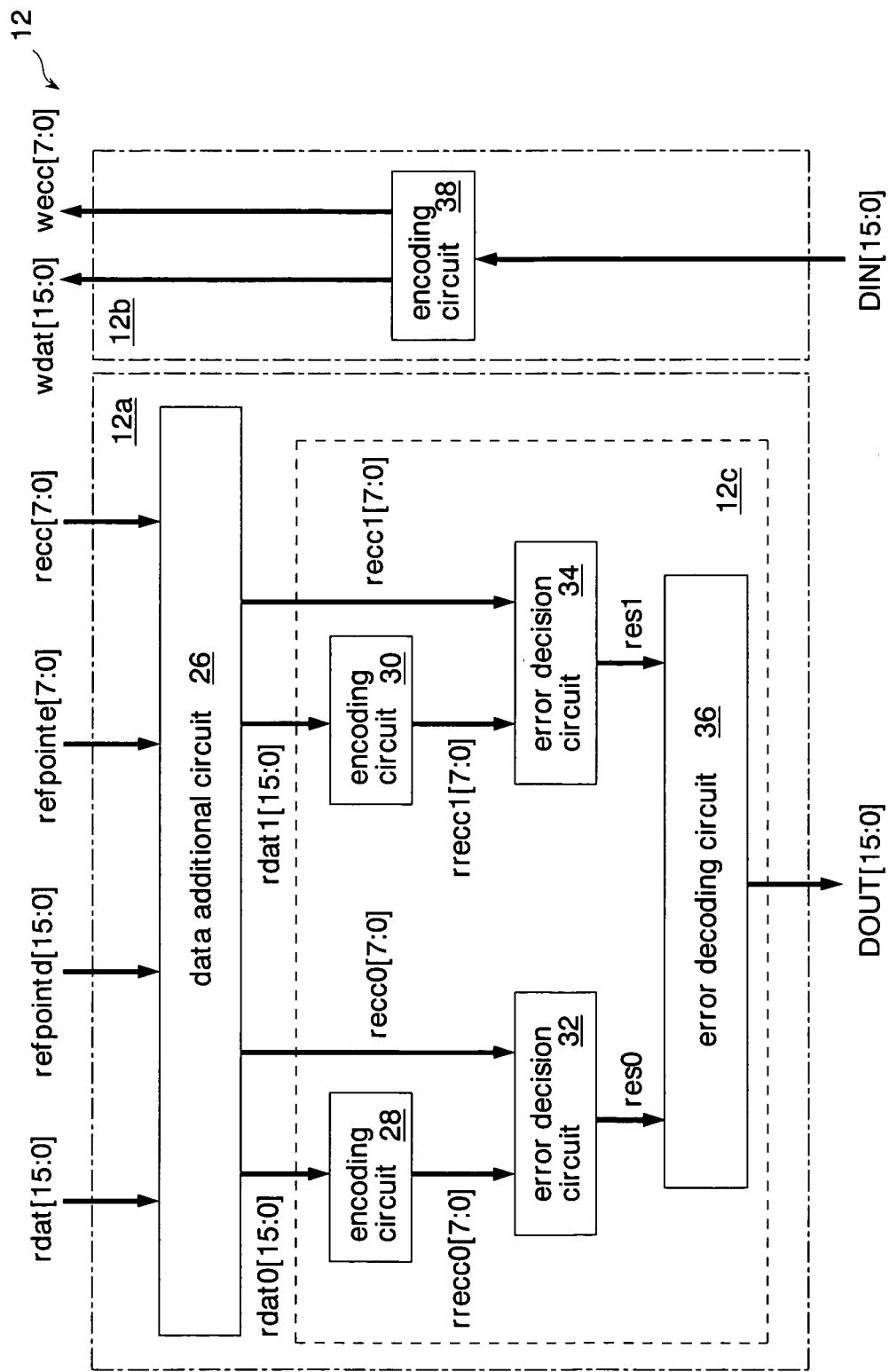
FIG. 2 is a detailed block diagram of a data control circuit shown in FIG. 1.

FIG. 2 shows a detailed data control circuit 12 shown in FIG. 1.

The data control circuit 12 has a data correction part 12a that corrects errors of read data rdat [15:0] and recc [7:0] from the memory core 24, and a data encoding part 12b that generates an error correction code from the input data DIN [15:0] to the memory core 24. The data correction unit 12a has a data additional circuit 26 and an error correction circuit 12c. The error correction circuit 12c has encoding circuits 28 and 30, error decision circuits 32 and 34, and an error decoding circuit 36. The data encoding part 12b has an encoding circuit 38.

The data additional circuit 26 generates read data rdat0 [15:0] and rdat1 [15:0], respectively, assuming to be "logic 1" and "logic 0" the read data from the data block (one of MBD0-15) operating as the refresh block that cannot perform the read operation. Alternatively, the data additional circuit 26 generates read data recc0 [7:0] and recc1 [7:0], assuming to be "logic 1" and "logic 0" the error correction code from the code block (one of MBE0-7) operating as the refresh block that cannot perform the read operation. In other words, the data additional circuit 26 adds data to be read from the refresh block to the read data from other blocks, as expectation data of "logic 1" or "logic 0", and generates read data strings rdat0 [15:0] and recc0 [7:0] and read data strings rdat1 [15:0] and recc1 [7:0].

The encoding circuit 28 generates error correction codes rrecc0 [7:0] (first code data) from the read data rdat0 [15:0] (information data string). The encoding circuit 30 generates error correction codes rrecc1 [7:0] (second code data) from the read data rdat1 [15:0] (information data string).

The error decision circuit 32 determines whether or not the error exists and the type of error by comparing the error correction code rrecc0 [7:0] with the error correction code recc0 [7:0], and outputs the decision results as a comparison result signal res0. The error decision circuit 34 determines whether or not the error exists and a type of error by comparing the error correction code rrecc1 [7:0] with the error correction code recc1 [7:0], and outputs the decision results as a comparison result signal res1. The comparison result signals res0 and res1 indicate one of match (no error), ECC error (single-bit error of the code block MBD; code error), single-bit error (single-bit error of the data block MBE), and two-or-more-bit error. Error items will be described in detail with reference to FIGS. 8 and 9.

The error decoding circuit 36 determines which is true between the comparison result signals res0 and res1, depending on the content of errors indicated by the comparison result signals res0 and res1, corrects the read data error depending on the determined comparison result signal res0 or res1, and outputs data as output data [15:0]. The output data [15:0] are output to the outside of the pseudo SRAM through the data terminals DQ15-0. When the comparison result signal res0 is determined to be true, data to be read from the refresh block is "logic 0". When the comparison result signal res1 is determined to be true, data to be read from the refresh block is "logic 1".

The encoding circuit 38 of the data encoding part 12b generates the error correction code wecc [7:0] from the input data [15:0] (write data), and outputs to the memory core 24 along with the write data wdat [15:0].

Figure 3:
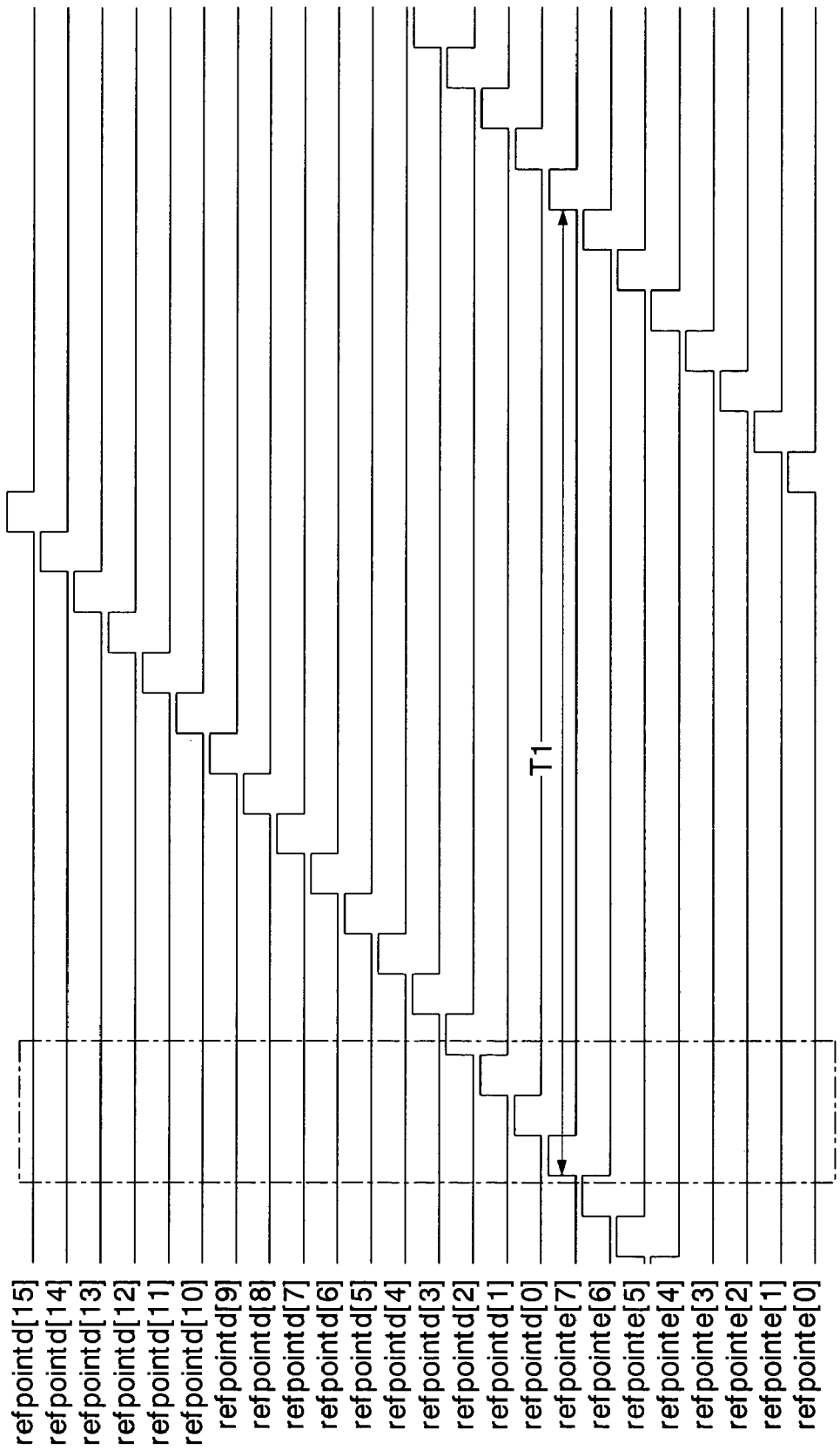
FIG. 3 is a timing diagram of an operation of a refresh control circuit shown in FIG. 1.

FIG. 3 shows an operation of the refresh control circuit 20 shown in FIG. 1.

The refresh control circuit 20 sequentially activates the refresh point signals refpointd [15:0] and refpointe [7:0]. An activation interval of each refresh point signal refpointd [15:0] and refpointe [7:0] (e.g., an activation interval T1 of the refresh point signal refpointd [0]) is set to be longer than the data retention time of the worst memory cell. The data retention time refers to a time in which the memory cell can retain data without losing data.

The activation interval T1 also corresponds to a refresh interval of each memory cell. For this reason, according to the embodiment, the worst memory cell already loses the data when the refresh operation is performed. However, the lost data can be decoded using an error correction function of the data control circuit 12. For this reason, the refresh interval of the memory cell can be set to be longer, and the refresh request interval and the refresh operation interval can be set to be longer. As a result, power consumption of the standby period can be reduced.

Figure 4:
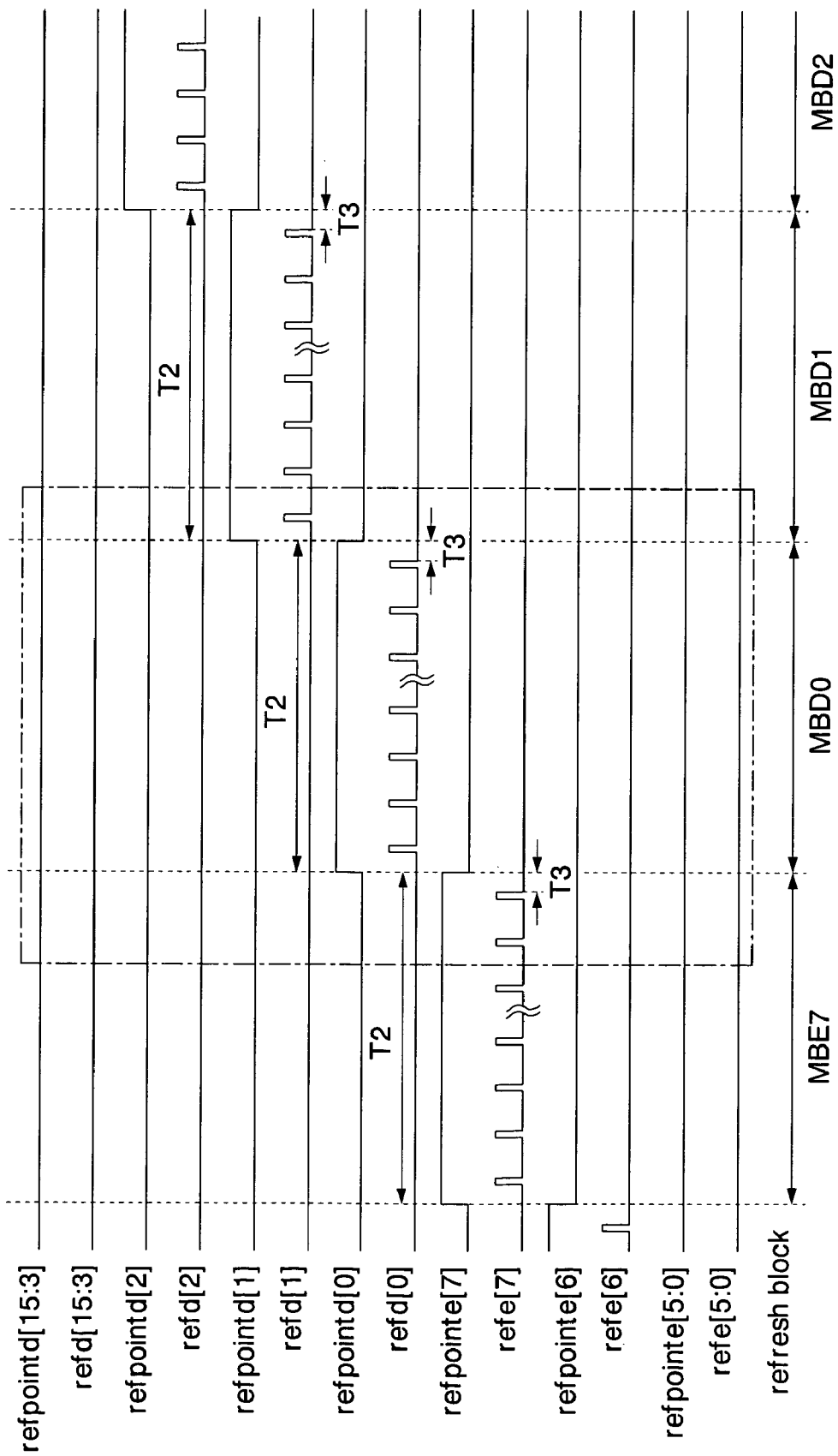
FIG. 4 is a detailed timing diagram of an operation of a refresh control circuit shown in FIG. 1.

FIG. 4 shows a detailed operation of the refresh control circuit 20 shown in FIG. 1. A waveform of FIG. 4 corresponds to a region indicated by one-dot chain line in FIG. 3.

For example, the refresh control circuit 20 activates the refresh request signal refe [7] of the corresponding data block MBD7 up to a high level a predetermined number of times, during an activation interval T2 of the refresh point signal refpointe [7]. Like this, the refresh operation responding to the refresh request is performed only in the block MBE (or MBD) corresponding to the activated refresh point signal refpointe (or refpointd). In other words, among the twenty-four blocks MBD15-0 and MBE7-0 accessed at the same time, only one block always operates as a refresh block that performs the refresh operation.

The number of activation of the refresh request signal refe [7] is the number needed to refresh all memory cells of the block MBE. For example, when one word line is selected for each refresh request, the number of activation is identical to the number of word lines of each block. The refresh point signals refpointd [15:0] and refpointe [7:0] may be switched from outputs of the last refresh request signal refd (or refe) of the refresh block to outputs of the first refresh request signal refd (or refe) of the next refresh block. An interval T3 from the output of the last refresh request signal to the switching of the refresh point signal is required for processing when the refresh request and the write request conflict with each other. The interval T3 will be described with reference to FIG. 6 illustrated below.

Figure 5:
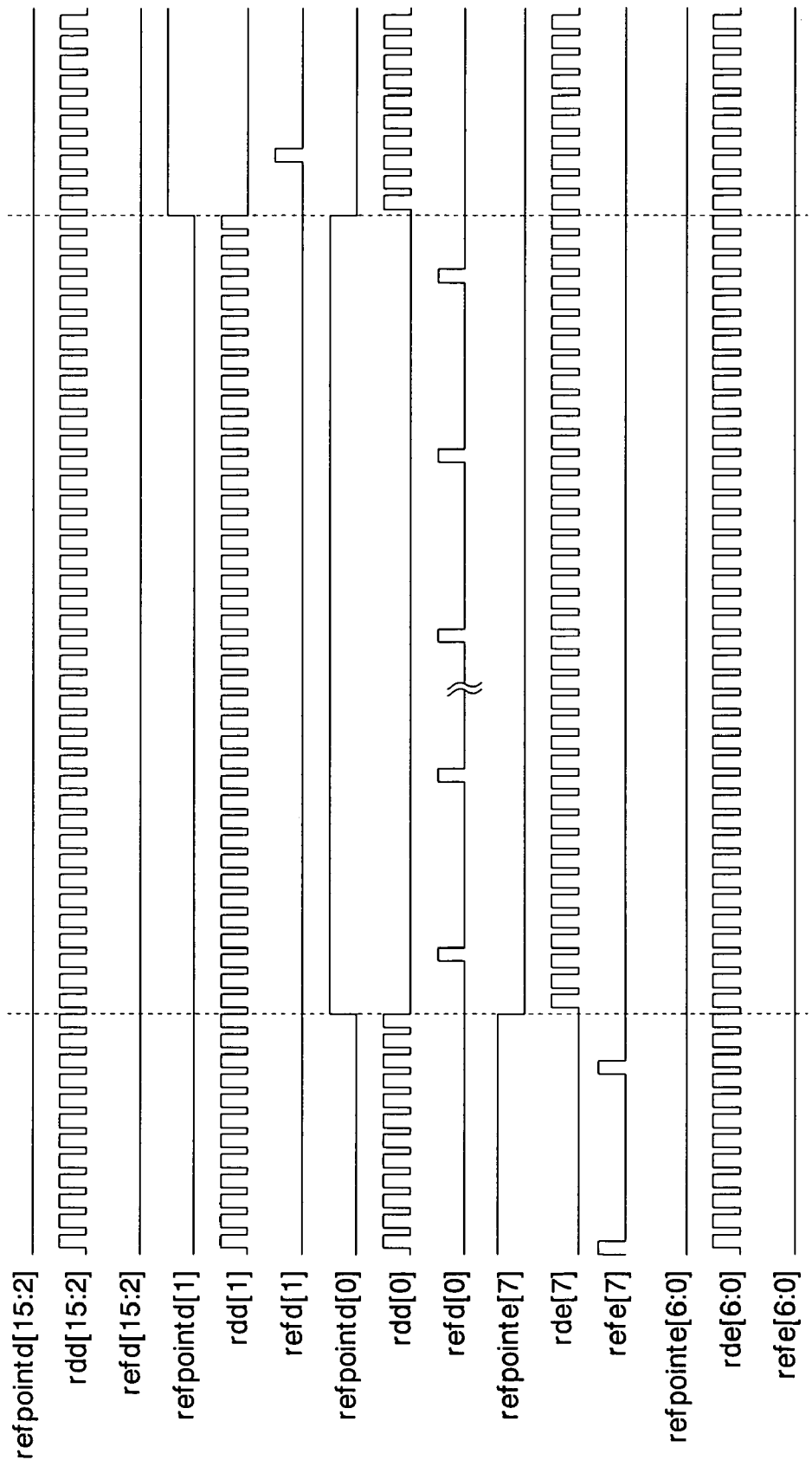
FIG. 5 is a timing diagram of an overview of a read operation according to the first embodiment of the invention.

FIG. 5 shows an overview of the read operation according to the first embodiment of the invention. A waveform of FIG. 5 corresponds to a region indicated by one-dot chain line in FIG. 4.

In this example, the pseudo SRAM successively receives the read command at the command terminal CMD, and successively performs the read operation. The access control circuit 18 shown in FIG. 1 masks outputs of the corresponding read request signals rdd [15:0] and rde [7:0], while it is activated by one of the refresh point signals refpointd [15:0] and refpointe [7:0]. For this reason, in the refresh block, the read operation is not performed, but only the refresh operation is performed. Data to be read from the refresh block that does not perform the read operation is decoded using the read data from the other blocks. For this reason, the read operation will not be delayed due to the refresh operation. In other words, without causing the read access time to be longer, the refresh operation can be perfectly hidden from the outside.

Figure 6:
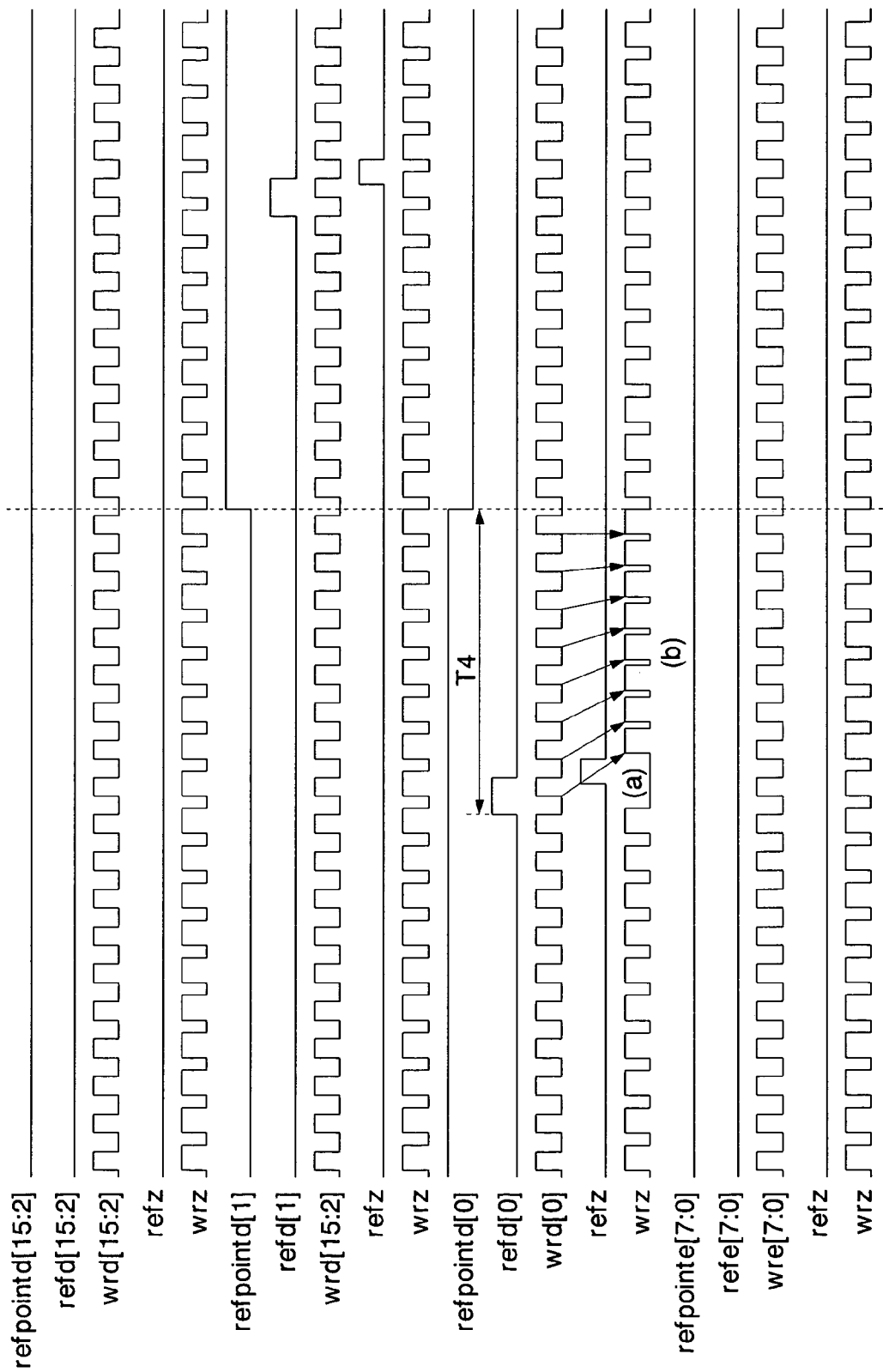
FIG. 6 is a timing diagram of an overview of a write operation according to the first embodiment of the invention.

FIG. 6 shows an overview of the write operation according to the first embodiment of the invention.

In this example, the pseudo SRAM successively receives the write command at the command terminal CMD, and successively performs the write operation. The blocks MBD15-0 and MBE7-0 generate write signals wrz responding to the write request signals wrd [15:0] and wre [7:0], respectively, and performs the write operation. A high level period of the write signal wrz indicates a write operation time of the blocks MBD15-0 and MBE7-0.

The write operation responding to the write request is performed in all of the blocks MBD15-0 and MBE7-0. Due to this reason, the conflict between the refresh request (refd or refe) and the write request (wrd or wre) is generated. The access control circuit 18 shown in FIG. 1 performs the refresh operation first, when the refresh request and the write request conflict with each other ((a) in FIG. 6). After completion of the refresh operation, the access control circuit 18 sequentially performs the write operation corresponding to the waiting write request ((b) in FIG. 6).

A minimum supply interval (output interval of wrd; external write cycle time) of the write command is designed to be longer than the write operation time (minimum output interval of wrz; internal write cycle time) of the memory core 24. For this reason, delay of the write operation accompanied by interruption of the refresh operation can be recovered by successively performing a predetermined number of the read operations. In this example, between the switching time T4 from the last refresh request signal refd (or refe) of a certain refresh block to the next refresh block, it is possible to insert the external write cycle time eight times, and to perform one time of the refresh operation and 8 times of the write operation. The switching time T4 refers to a recovery time until the delay of the write operation accompanied by the interruption of the refresh operation is recovered. For this reason, even when the write commands are successively supplied, the write operation of the refresh block can be definitely completed before the refresh block is switched.

As a result, immediately after the switching from the refresh block into the general data block or code block, even when the read command is supplied, the output of the read data can be prevented from being delayed. In other words, the read access time and the read cycle time can be prevented from being lengthened due to the write operation. In addition, a switching time T4 is set to be (Tcyce/δ)×Tcyce or more, assuming that δ refers to a difference between the external write cycle time Tcyce and the internal write cycle time Tcyci.

In addition, the switching time T4 may be designed such that the following equation (1) is satisfied. The difference δ will be negligible when the switching time T4 can be set to be larger than the internal write cycle time Tcyci. For this reason, the external write cycle time Tcyce can be arranged to be almost identical to the internal write cycle time Tcyci. In other words, there is no access penalty in performing the refresh operation earlier than the write operation.

$$(T4/Tcyci) - (T4/(Tcyci+\delta)) \geq Tcyci \qquad (1)$$

FIG. 7 shows a generation rule of a parity code according to the first embodiment of the invention.

According to the present embodiment, a horizontal/vertical parity having a minimum Hamming distance of "4" is used as an error correction code. The parity may be either an even parity or an odd parity. The code can correct a single bit error, and at the same time, detect a double bit error.

When data corresponding to the same address within the data blocks MBD0-15 in shown in four columns and four rows, the data blocks MBD0-15 can be represented in row addresses L1 to L0 and column addresses C1 to C0, respectively. For example, the data block MBD0 can be represented in L1–L0="00", C1–C0="00", and the data block MBD10 can be represented in L1–L0="10", C1–C0="10".

For example, in the code block MBE0, parities of the data blocks MBD0-3, 8–11 having the row address L0 of "0" are stored (parity LP0). In the code block MBE1, parities of the data blocks MBD4-7, 12–15 having the row address L0 of "1" are stored (parity LP1). In the code block MBE2, parities of the data blocks MBD0-5 having the row address L1 of "0" are stored (parity LP2). In the code block MBE3, parities of the data blocks MBD8-15 having the row address L1 of "1" are stored (parity LP3).

In the same manner, in the code block MBE4, parities of the data blocks MBD0, 4, 8, 12, 2, 6, 10, 14 having the column address C0 of "0" are stored (parity CP0). In the code block MBE5, parities of the data blocks MBD1, 5, 9, 13, 3, 7, 11, 15 having the column address C0 of "1" are stored (parity CP1). In the code block MBE6, parities of the data blocks MBD0, 4, 8, 12, 1, 5, 9, 13 having the column address C1 of "0" are stored (parity CP2). In the code block MBE7, parities of the data blocks MBD2, 6, 10, 14, 3, 7, 11, 15 having the column address C1 of "1" are stored (parity CP3).

The above-mentioned horizontal/vertical parity code needs to be 8 bits, 10 bits, 12 bits, 14 bits and 16 bits, respectively, when the decoded information data are 16 bits (the present embodiment), 32 bits, 64 bits, 128 bits and 256 bits. In other words, when the information bit is n times of 2, the code data is required to be 2n bits. With respect to this, a general horizontal/vertical parity code needs to be 8 bits, 12 bits, 16 bits, 24 bits and 32 bits, respectively, when the decoded information data are 16 bits, 32 bits, 64 bits, 128 bits, and 256 bits. For this reason, the above-mentioned horizontal/vertical parity code can reduce the number of code blocks to be less than the number of the general horizontal/vertical parity code, when the information data is 32 bits or more, in particular.

Figure 8:
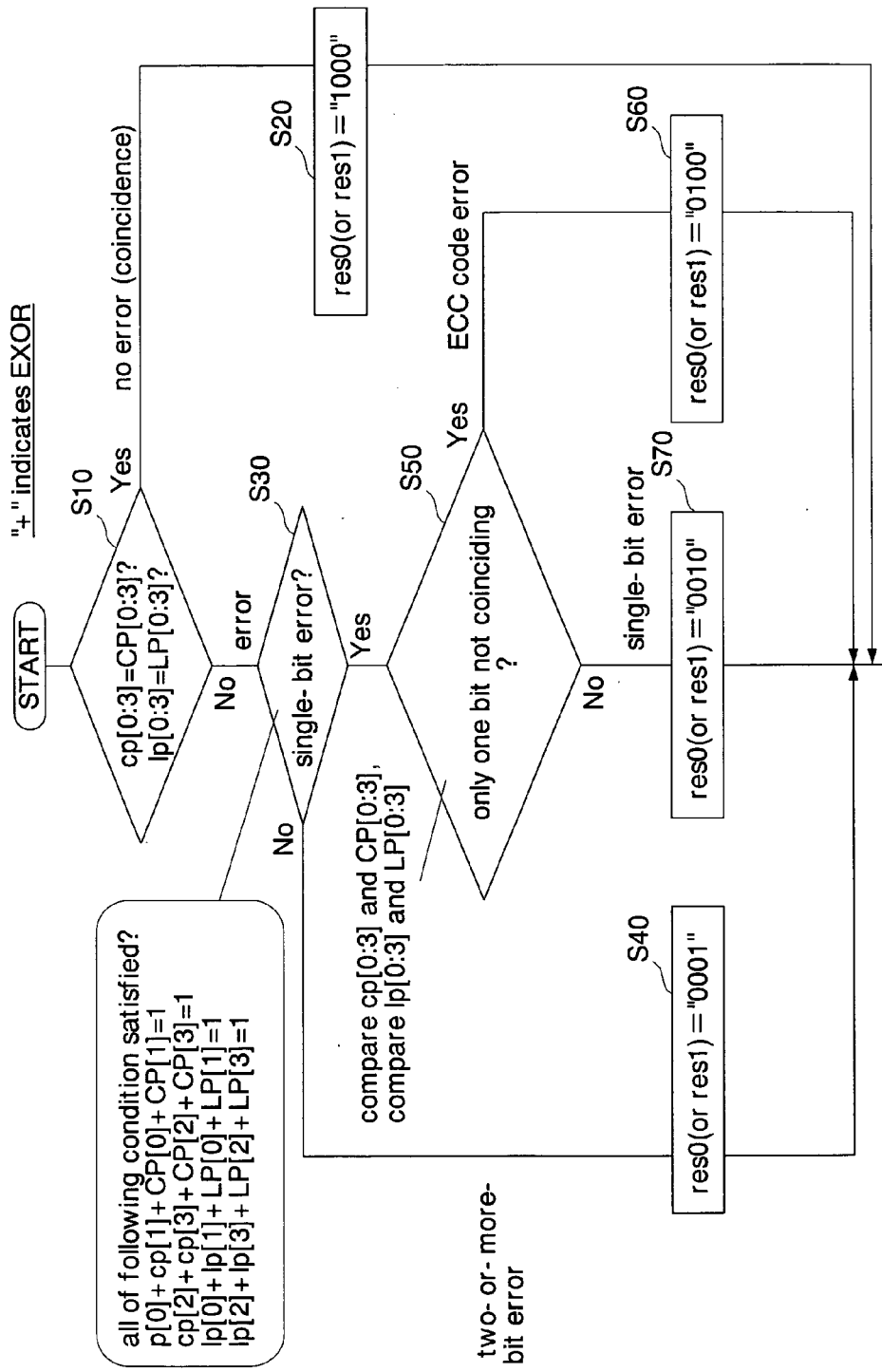
FIG. 8 is a flowchart of an overview of an error decision circuit shown in FIG. 2.

FIG. 8 shows an overview of an operation of the error decision circuits 32 and 34 shown in FIG. 2. Here, the error correction codes recc [0:7] read from the code blocks MBE0-7 refer to Ip [0:3] and cp [0:3], and the error correction cdes rrecc0 [0:7] (or rrecc1 [0:7]) generated by the encoding circuit 28 (30) shown in FIG. 2 refer to LP [0:3] and CP [0:3], depending on data read from the data blocks MBD0-7.

First, at step S10, cp [0:3] and CP [0:3], and Ip [0:3] and LP [0:3] are compared, respectively. When cp [0:3] and CP [0:3], and Ip [0:3] and LP [0:3] are all matched, no error is determined, so that the processing proceeds to step S20. When at least one of cp [0:3] and CP [0:3], and Ip [0:3] and LP [0:3] are not matched, it is determined to be "error exists", the processing proceeds to step S30. At step S20, the comparison result signal res0 (or res1)="1000" indicating no error is output, and the processing ends.

At step S30, it is determined whether all of the following equations (2) to (5) are satisfied. When all the equations are satisfied, it is determined to be "single-bit error", and the processing proceeds to step S50. When any one of the equations is not satisfied, it is determined to be "two-or-more-bit error", and the processing proceeds to step S40. At step S40, the comparison result signal res0 (or res1)="0001" indicating "two-or-more-bit error", the processing ends.

$$cp[0]+cp[1]+CP[0]+CP[1]=1 \quad (2)$$

$$cp[2]+cp[3]+CP[2]+CP[3]=1 \quad (3)$$

$$Ip[0]+Ip[1]+LP[0]+LP[1]=1 \quad (4)$$

$$Ip[2]+Ip[3]+LP[2]+LP[3]=1 \quad (5)$$

At step S50, cp [0:3] and CP [0:3], and Ip [0:3] and LP [0:3] are compared, respectively. Among the 8 bits compared, in case of only 1 bit mismatch, it is determined to be "an ECC code error", and the processing proceeds to step S60. In the remaining cases, it is determined to be a single-bit error, and the processing proceeds to step S70. At step S60, the comparison result signal res0 (or res1)="0100" indicating the ECC code error is output, the processing ends. At step S70, the comparison result signal res0 (or res1)= "00100" indicating single-bit error is output, the processing ends.

FIG. 9 shows an overview of the error decoding circuit 36 shown in FIG. 2.

The error decoding circuit 36 receives the comparison result signals res0 and res1 from the error decision circuits 32 and 34. As shown in FIG. 8, the comparison result signals res0 and res1 indicates one of binary "1000 (no error)", "0100 (ECC error; single-bit error of code block)", "0010 (single-bit error; single-bit error of data block)", and "0001 (two-or-more-bit error)", depending on the error contents.

(a), (b), and (c) in FIG. 9 show a case in which one of the data blocks MBD0-15 operates as the refresh block and data to be read from the refresh block is "logic 0". For (a) in FIG. 9, when there is no error for the read operation, the comparison result signal res0 indicating that the read data from the refresh block is "logic 0" represents no error, and the comparison result signal res1 indicating that the read data from the refresh block is "logic 1" represents a single-bit error (refresh block only error).

For (b) in FIG. 9, when there is a single-bit error in any of the data blocks MBD0-15 other than the refresh block for the read operation, the comparison result signal res0 indicates single-bit error, and the comparison result signal res1 indicates two-or-more-bit error (error in 1 bit of the refresh block and 1 bit of the data block). For (c) in FIG. 9, when there is single-bit error in one of the code blocks MBE0-7 for the read operation, the comparison result signal res0 indicates ECC error, and the comparison result signal res1 indicates two-or-more-bit error (a single-bit error of the refresh block and ECC error).

(d), (e), and (f) in FIG. 9 shows a case in which one of the data blocks MBD0-15 operates as the refresh block and data to be read from the refresh block is "logic 1". For (d), (e), and (f) in FIG. 9, the logic value of data to be read from the refresh block is opposite to (a), (b), and (c) in FIG. 9. For this reason, the comparison result signals res0 and res1 are opposite to (a), (b), and (c) in FIG. 9.

(g), (h), and (i) in FIG. 9 show a case in which one of the code blocks MBE0-7 operates as the refresh block and data to be read from the refresh block is "logic 0". For (g) in FIG. 9, when there is no error for the read operation, the comparison result signal res0 indicating that the read data from the refresh block is "logic 0" represents no error, and the comparison result signal res1 indicating that the read data from the refresh block is "logic 1" represents ECC error (refresh block only error).

For (h) in FIG. 9, when there is single-bit error in any of the data blocks MBD0-15 other than the refresh block for the read operation, the comparison result signal res0 indicates single-bit error, and the comparison result signal res1 indicates two-or-more-bit error (error in a single-bit error of the refresh block and a single-bit error of the data block). For (i) in FIG. 9, when there is a single-bit error in one of the code blocks MBE0-7 other than the refresh block for the read operation, the comparison result signal res0 indicates ECC error, and the comparison result signal res1 indicates two-or-more-bit error (a single-bit error of the refresh block and ECC error).

(j), (k), and (l) in FIG. 9 show a case in which one of the code blocks MBE0-7 operates as the refresh block and data to be read from the refresh block is "logic 1". For (j), (k), and (l) in FIG. 9, the logic value of data to be read from the refresh block is opposite to (g), (h), and (i) in FIG. 9. For this reason, the comparison result signals res0 and res1 are opposite to (g), (h), and (i) in FIG. 9.

The error decoding circuit 36 takes one of the comparison result signals res0 and res1 as a true error, and corrects the error based on the result. Here, the error correction circuit 36 has the following priority of the error decision: no error>ECC error>single-bit error>two-or-more-bit error. In other words, one of the comparison result signal having less error is considered to be true. For this reason, for (a), (d), (g), and (j) in FIG. 9, no error is determined. For (b), (e), (h), and (k) in FIG. 9, a single-bit error is determined. For (c), (f), (i), and (l) in FIG. 9, an ECC error is determined.

The error decoding circuit 36 considers the logic value corresponding to the comparison result signals res0 and res1 having a higher priority as a logic value of data to be read from the refresh block, and outputs it as the output data DOUT [15:0]. Specifically, when res0 has a higher priority than res1, a bit of the output data DOUT corresponding to the refresh block is set to "logic 0". When res1 has a higher priority than res0, a bit of the output data DOUT corresponding to the refresh block is set to "logic 1".

In addition, when the error decoding circuit 36 determines that there exists a single bit error in one of the data blocks MBD0-15, the error decoding circuit 36 corrects the error. The data blocks MBD0-15 having an error (error address that generates single-bit error) are determined by assigning the errors correction codes recc [0:7] to the following equations (6) and (7). For example, in the case of (L1, L0)="01", (C1, C0)="11", the error block is the data block MBD7, as shown in FIG. 7. Here, the error decoding circuit 36 inverts a logic value of data read from the data block MBD7 to output to the data output buffer 14. In addition, according to the present embodiment, the error corrected data is not written to the block. This is because a single-bit error and an ECC error are related to a lack of the data retention time or a physical defect of the memory cell. For this type of error, even when correct data is written to the memory cell, the error will be generated again, so that the processing time is useless.

$$(L1, L0)=(lp[3]+LP[3], lp[1]+LP[1]) \quad (6)$$

$$(C1, C0)=(cp[3]+CP[3], cp[1]+CP[1]) \quad (7)$$

Figure 10:
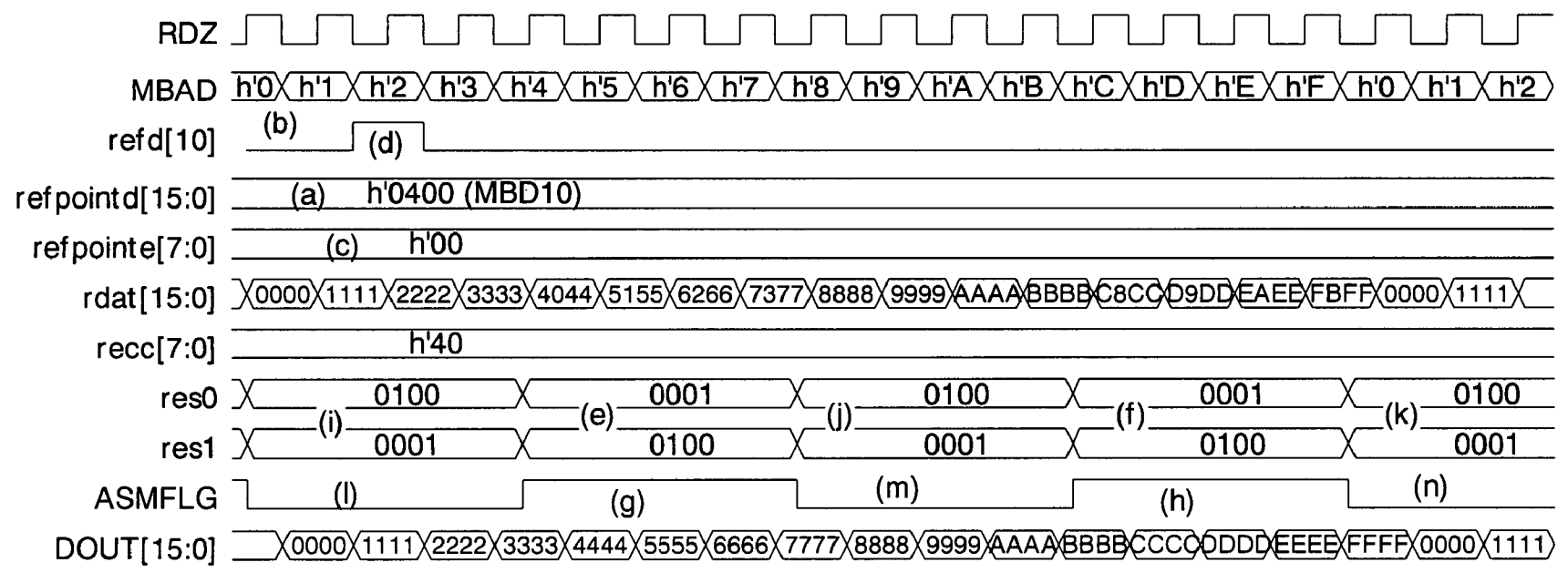

FIG. 10 shows an example (simulation result) of the read operation according to the first embodiment of the invention.

In this example, the data block MBD10 operates as a refresh block ((a) in FIG. 10). The pseudo SRAM reads row addresses MBAD from "0" to "F" in hexadecimal number, along with a read command RDZ, sequentially receives them as an address, and successively performs the read operation ((b) in FIG. 10).

In the memory cells of the data blocks MBD0-15 indicated by the read addresses "0", "1", "2", . . . , "D", "E", and "F", the hexadecimal numbers "0000", "1111", "2222", . . . "DDDD", "EEEE", and "FFFF" are already written. In the memory cells of the code blocks MBE0-7 indicated by the read addresses "0", "1", "2", . . . , "D", "E", "F", the hexadecimal number "00" is already written. However, in this example, a single-bit error (ECC error) is generated in the code block MBE6, so that the read data recc [7:0] becomes "40" in hexadecimal number ((c) in FIG. 10). In addition, for the read operation of the actual different address, it is rare that a single-bit error is successively generated in the code block MBE6.

The refresh control circuit 20 shown in FIG. 1 outputs the refresh request signal refd [10] during the read operation of the read address "2" ((d) in FIG. 10). The memory core 24 responds to the refresh request signal refd [10], and performs the refresh operation of the data block MBD10.

The data from the data block MBD10 that operates as the refresh block is not read, so that the tenth bit of the read data rdat [15:0] is read as, for example, "logic 0". For this reason, when the expectation value of the tenth bit is "logic 1" (e.g., "4444", "5555", etc), the read error of the refresh block is generated. At this time, the error decoding circuit 36 receives the comparison result signal res0 ("0001") indicating a two-or-more-bit error and the comparison result signal res1 ("0100") indicating the ECC error, determines that the priority of the comparison result signal res1 is higher, and detects generation of the ECC error ((e) and (f) in FIG. 10).

In addition, the error decoding circuit 36 has a higher priority of the comparison result signal res1, so that the logic value of data to be read from the refresh block is determined to be "logic 1", and an assume flag ASMFLG is set to "logic 1" ((g) and (h) in FIG. 10). The assume flag ASMFLG is an internal signal used in the error decoding circuit 36. With the setting of the assume flag ASMFLG, the tenth bit of the output data [15:0] is set to "logic 1". In other words, data from the refresh block that does not perform the read operation is generated.

Further, when the expectation value of the tenth bit of the read data rdat [15:0] is "logic 0" (e.g., "0000", "1111", "2222", "3333", and so on), the read error of the refresh block will not be generated. At this time, the error decoding circuit 36 receives the comparison result signal res0 ("0100") indicating the ECC error and the comparison result signal res1 ("0001") indicating a two-or-more-bit error, determines that the comparison result signal res0 has a higher priority, and detects generation of the ECC error ((i), (j), and (k) in FIG. 10).

In addition, since the comparison result signal res0 has a higher priority, the error decoding circuit 36 determines the logic value of data to be read from the refresh block to be "logic 0", and sets the assume flag ASMFLG to be "logic 0" ((l), (m), and (n) in FIG. 10). With setting of the assume flag ASMFLG, the tenth bit of the output data [15:0] is set to "logic 0". In other words, data from the refresh block that does not perform the read operation is regenerated.

Figure 11:
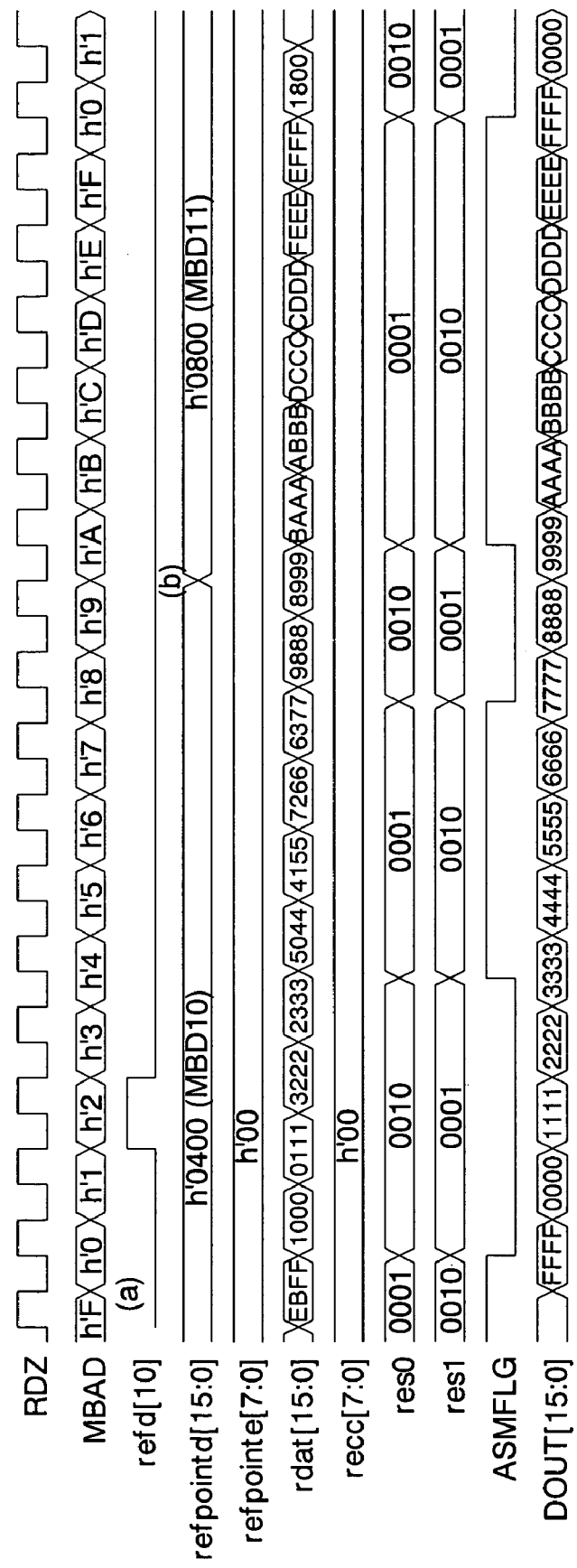
FIG. 11 is a timing diagram of another example of a read operation according to the first embodiment of the invention.

FIG. 11 shows another example (simulation result) of the read operation according to the first embodiment of the invention. A detailed description on the operation shown in FIG. 10 will be omitted.

In this example, as shown in FIG. 10, the pseudo SRAM reads the row addresses MBAD from "0" to "F" in hexadecimal numbers, along with a read command RDZ, sequentially receives them as an address, and successively performs the read operation ((a) in FIG. 11). The refresh block is switched from the data block MBD10 to the data block MBD11 during the successive read operation ((b) in FIG. 11). Data already written to the data block MBD0-15 and the code block MBE0-7 is shown in FIG. 10. In this example, single-bit error of the data block MBD12 is generated, and the twelfth bit of the read data rdat [15:0] is changed for each read operation "0" and "1". In addition, for the read operation of the actual different address, it is rare that single-bit error is successively generated in the code block MBD12.

Data from the data block MBD10 operating as the refresh block is not read, so that the tenth bit of the read data rdat [15:0] is read as, for example, "logic 0". In the same manner, data from the data block MBD11 operating as the refresh block is not read, so that the eleventh bit of the read data rdat [15:0] is read as, for example, "logic 1".

In the same manner as in FIG. 10, the error decision circuits 32 and 34 of the data control circuit 12 generate the comparison result signals res0 and res1 from the read data rdat [15:0] and the error correction codes recc [7:0]. The comparison result signals res0 and res1 indicate two-or-more-bit error ("0001") or single-bit error of the data block ("0010"). The error decoding circuit 36 regenerates data that cannot be read by the refresh operation, based on the comparison result signals res0 and res1. In addition, the error decoding circuit 36 determines a block address, in which single-bit error is generated, from the error correction codes recc [7:0], as shown in the above-mentioned equations 6 and 7, and inverts data read from the block address. In other words, single-bit error generated at the data block MBD12 is corrected.

According to the present embodiment, the pseudo SRAM includes a data additional circuit 26 that adds the expectation data to be read from the refresh block (logic 1, logic 0) to data to be read from other blocks, respectively, to thus generate two read data strings rdat0 and rdat1; and an error correction circuit 12c that detects each error for the read data strings rdat0 and rdat1, and considers the most reliable error detection result among these to be true. For this reason, the refresh operation can be hidden against a system that accesses the pseudo SRAM, and at the same time, can correct single-bit error generated in blocks other than the refresh block. This is achieved with the horizontal/vertical parity code having the minimum distance of "4".

The refresh operation can be hidden without conflict with the read operation, so that the read cycle time can be prevented from being lengthened. In addition, the refresh request interval can extend, and power consumption during the standby period can be reduced. Therefore, the pseudo SRAM can be arranged to be equivalent to an SRAM in terms of both AC and DC characteristics In other words, the pseudo SRAM having a full compatibility with the SRAM can be provided to a user. The user can reduce the cost, only by changing the SRAM embedded on the system into the pseudo SRAM of the invention.

With the refresh point signals refpointd [15:0] and refpointd [7:0] output by the refresh control circuit 20, only one of the data blocks MBD0-15 and the code blocks MBE0-7 is set to the refresh block. Data that cannot be read by the refresh operation is usually as one bit, so that the data that cannot be read by the refresh operation can be simply decoded with the data additional circuit 26 and the error correction circuit 12c.

The access control circuit 18 does not output the read request signals rdd and rde to the refresh block, so that the refresh block does not perform the read operation regardless of whether the refresh operation is being performed. For this reason, reading of a block control circuit BCNT can be simply controlled.

The block control circuit BCNT performs the refresh operation and then performs the write operation, when the refresh request signal refd (or refe) and the write request signal wrd (or wre) conflict with each other. For this reason, the write data wdat (or wecc) can be definitely written to the refresh block.

The external write cycle time Tcyce, which is the minimum supply interval for the write command, is set to be longer than the internal write cycle time Tcyci. Specifically, among the eight times of the external write cycle time Tcyce, one time of the refresh operation and eight times of the write operation can be performed. For this reason, delay of the write operation due to the priority of the refresh operation can be gradually recovered. In other words, the write data can be definitely written to the refresh block.

In addition, during the switching period changed from the final refresh request signal of the refresh block to the next refresh block, the external write cycle time Tcyce can be inserted eight times. For this reason, in the write operation delayed by the refresh request for a certain block, the block is completed between the refresh blocks. Therefore, the read operation can be prevented from delaying due to the delay of the write operation among the refresh block, and increase in the read access due to the conflict between the refresh operation and the write operation can also be prevented.

The error correction circuit 12c detects four types of error items (no error, single-bit error of any data block, single-bit error of any code block, and two-or-more-bit error), and considers an error item having a higher priority to be true. For this reason, the error correction circuit 12c can be arranged in a simplified logic.

The data blocks MBD0-15 are formed, respectively, corresponding to the data terminals DQ0-15, so that errors can be corrected in a data unit that is input and output to the pseudo SRAM at one time. For this reason, the logic for the generation of the encoding data and the error correction of the read data can be simply provided, and the read cycle time and the write cycle time can be prevented from increasing.

Figure 12:
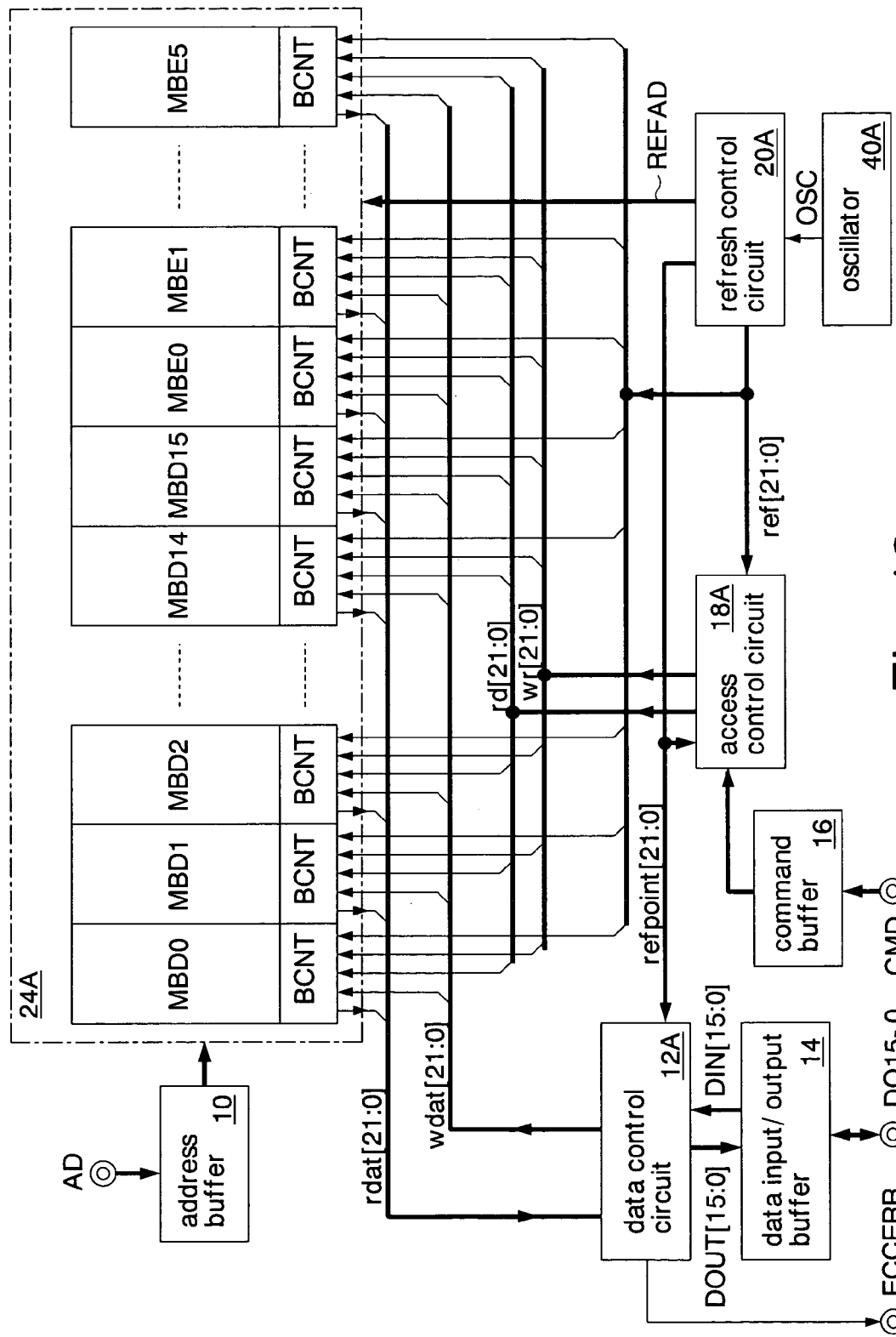
FIG. 12 is a block diagram of a second embodiment of the invention.

FIG. 12 shows a semiconductor memory according to the second embodiment of the invention. Like numerals are given to circuits and signals identical to the circuits and signals illustrated in the first embodiment, and the detailed description thereof will be omitted.

Figure 13:
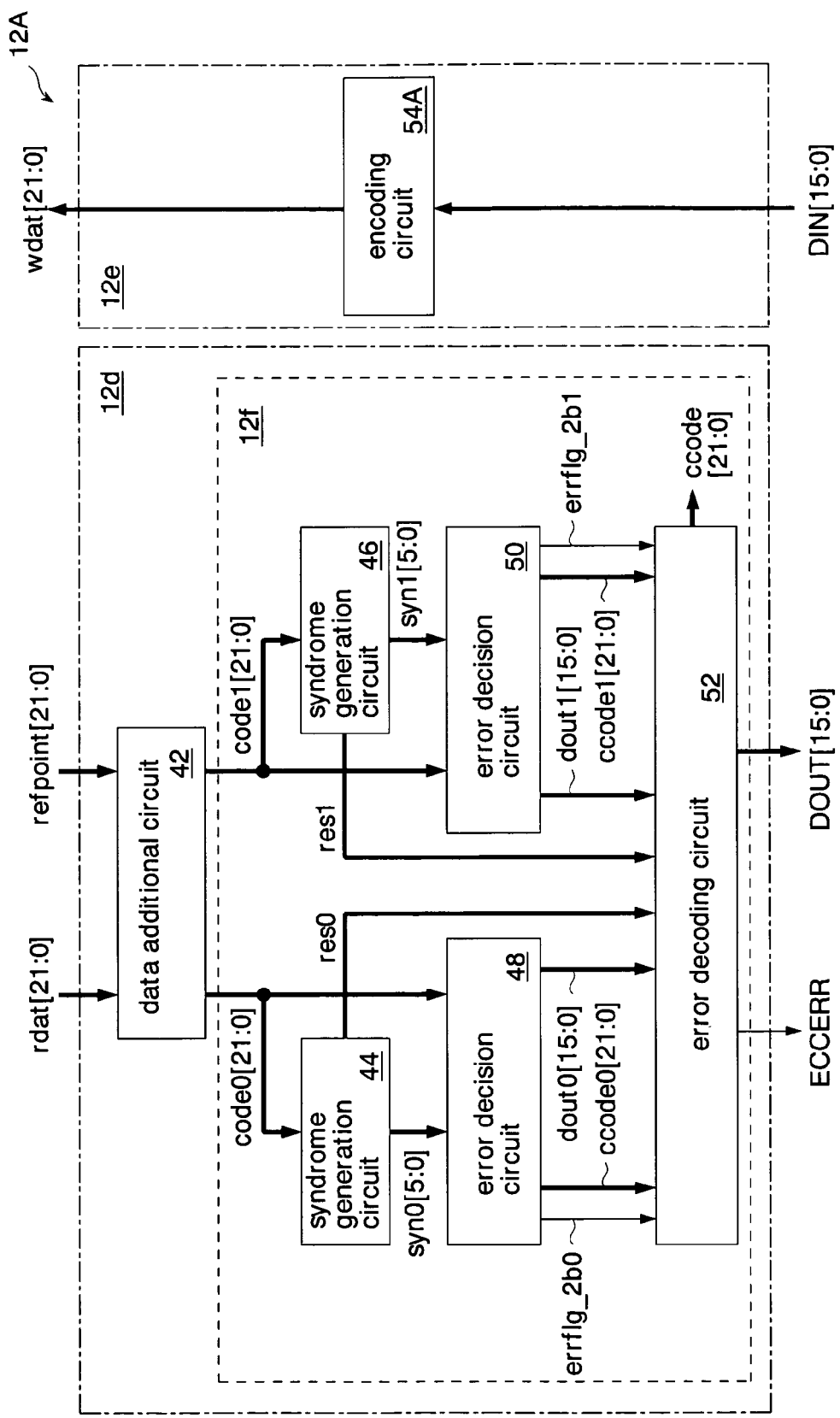
FIG. 13 is a detailed block diagram of a data control circuit shown in FIG. 12.

The semiconductor memory of the present embodiment is formed on a silicon substrate, as a clock asynchronous type using a CMOS process. In other words, the pseudo SRAM does not have a clock terminal for receiving clock signals. In addition, according to the present embodiment, as shown in FIGS. 13 and 14, an extracted Hamming code is used as an error correction code. The minimum Hamming distance of the extracted Hamming code is "4", and single-bit error correction and double bit error detection can be provided at the same time.

The pseudo SRAM has a data control circuit 12A, an access control circuit 18A, a refresh control circuit 20A and a memory core 24A, instead of the data control circuit 12, the access control circuit 18, the refresh control circuit 20, and the memory core 24 in the first embodiment. In addition, the pseudo SRAM further includes an oscillator 40A that generates a clock signal OSC.

The memory core 24A has 16 data blocks MBD0-15 corresponding to the dater terminals DQ15-0, respectively, six code blocks MBE0-5 holding each bit of six bit error correction codes, respectively, and a block control circuit BCNT. Arrangements and memory capacities of the data blocks MBD0-15 and the code blocks MBE0-5 are identical to those in the first embodiment. In other words, each of the blocks MBD0-15 and MBE0-5 has dynamic memory cells, word lines, and bit lines connected to the dynamic memory cells.

The extracted Hamming code requires 6 bits, 7 bits, 8 bits, 9 bits, and 10 bits, respectively, when the decoded information data is 16 bits (the present embodiment), 32 bits, 64 bits, 128 bits, and 256 bits. In other words, when the information bit is n times of 2, the code data is required to be n+2 bit. For this reason, the extracted Hamming code has a higher encoding ratio than the above-mentioned horizontal/vertical parity code, and can reduce the number of code blocks MBE. In addition, signal lines arranged in the code blocks MBE can be reduced. As a result, a chip size of the pseudo SRAM can be reduced.

The oscillator 40A self-oscillates the clock signal OSC at a predetermined period, after the power is on. According to the present embodiment, a frequency of the clock signal OSC is set to be identical to a frequency of the clock signal CLK of the first embodiment.

The refresh control circuit 20A is identical to the refresh control circuit 20 of the first embodiment, except that a refresh point signal refpoint [21:0] and a refresh request signal ref [21:0] are output instead of the refresh point signals refpointd [15:0] and refpointe [7:0], and the refresh request signals refd [15:0] and refe [7:0]. In other words, the refresh control circuit 20A has a timer, a counter, a shift register, and a refresh request generation circuit that operates in synchronization with the clock signal OSC. The shift register has 22 latches connected in cascade, and an output of the latch at the final stage is fed to an input of the latch at the initial stage. The shift register shift operates for each counter overflow, and outputs from the latches the refresh point signal refpoint [21:0] for indicating the blocks MBD0-15 and MBE0-5 that perform the refresh operation. One of the blocks MBD0-15 and MBE0-5 selected by the refresh point signal refpoint [21:0] operates as a refresh block that performs the refresh operation. The refresh request generation circuit outputs the corresponding refresh request signal ref [21:0] in synchronization with the periodic signal, during the activation period of the refresh point signal refpoint [21:0].

An operation of the refresh control circuit 20A is identical to those shown in FIGS. 3 and 4, except that they have different signal names. In other words, the activation interval T1 (corresponding to the refresh interval of each memory cell) of each refresh point signals refpoint [21:0] is set to be longer than a memory retention time of the worst memory cell. The worst memory cell has already lost the data when the refresh operation is performed. However, the lost data is decoded with an error correction function of the data control circuit 12A. As a result, in the same manner as in the first embodiment, power consumption during the standby period can be reduced.

The access control signal 18A decodes the command signal CMD, and outputs the read request signal rd [21:0] or the write request signal wr [21:0] that operate the read operation depending on the decoded result. However, the access control circuit 18A masks any output of the corresponding read request signal rd [21:0], when any of the refresh point signal refpoint [21:0] are activated. In addition, when any one of the refresh request signals ref [21:0] is received, the access control circuit 18A sequentially outputs any one of the corresponding write request signals wr [21:0], by delaying only for the period that the refresh operation is inserted.

The data control circuit 12A outputs the input data DIN [15:0], during the write operation, and outputs to the memory core 24A as data wdat [21:0]. Upper 6 bits [21:16] of the write data wdat [21:0] is an error correction code (write code data) generated from the input data DIN [15:0]. In addition, the data control circuit 12 receives read data rdat [21:0] read from the memory core 24 during the read operation, and corrects an error of the read data from the memory cell having data being not read by the refresh operation and data whose data retention characteristics are poor, and outputs the read data as output data DOUT [15:0]. Upper 6 bits [21:16] of the read data rdat [21:0] is an error correction data (read code data) read from the code blocks MBE21-16. In addition, the data control circuit 12A output an ECC error signal ECCERR to the error terminal, when two-or-more-bit error that cannot be corrected is detected during the read operation.

In addition, bits of the write request signal wr [21:0], the read request signal rd [21:0], the refresh point signal refpoint [21:0], the refresh request signal ref [21:0], the write data wdat [21:0], and the read data rdat [21:0] correspond to the data blocks MBD15-0 and the code blocks MBE21-16, respectively. Bits of the input data DIN [15:0] and the output data DOUT [15:0] correspond to the block numbers of the data blocks MBD15-0, respectively.

FIG. 13 shows a detailed data control circuit 12A shown in FIG. 12. The data control circuit 12A has a data correction part 12d that corrects read data from the memory core 24A and a data encoding part 12e that generates an error correction code from the write data to the memory core 24A. The data correction part 12d has a data additional circuit 42 and an error correction circuit 12f. The error correction circuit 12f has syndrome generation circuits 44 and 46, error decision circuits 48 and 50, and an error decoding circuit 52. The data decoding part 12e has an encoding circuit 54A.

The data additional circuit 42 generates read data strings code0 [21:0] and code1 [21:0], assuming to be "logic 1" and "logic 0" the read data from the blocks operating as the refresh block that cannot perform the read operation (any of MBD0-15 and MBE0-5). The data additional circuit 42 determines the refresh block using the refresh point signals refpoint [21:0]. In other words, the data additional circuit 42 adds data to be read from the refresh block to the read data from other blocks, as expectation data of "logic 1" or "logic 0", and generates the read data strings code0 [2 1:0] and code1 [21:0].

The syndrome generation circuit 44 generates a syndrome syn0 [5:0] from the read data code0 [21:0]. In addition, the syndrome generation circuit 44 determines a type of the error using the generated syndrome syn0 [5:0], and outputs as the comparison result signal res0. The syndrome generation circuit 46 generates a syndrome syn1 [5:0] from the read data code1 [21:0]. In addition, the syndrome generation circuit 46 determines a type of the error using the generated syndrome syn1 [5:0], and outputs as the comparison result signal res1. Specifications of the comparison result signals res0 and res1 are almost identical to those in the first embodiment. However, in the present embodiment, "ECC error" is not provided. For this reason, the priority of the error determination is as follows: no error>single-bit error>two-or-more-bit errors.

The error decision circuit 48 determines the type of the error and an error block by using the syndrome syn0 [5:0], and corrects the error of the read data code0 [21:0]. The corrected 22 bits of read data is output as the correction code ccode0 [21:0]. The lower 16 bits corresponding to the memory blocks MBD15-0 out of the corrected 22 bits of read data are output as the output data dout0 [15:0]. In addition, the error decision circuit 48 outputs an error flag signal errflg_2b0 when two-or-more-bit error is detected.

The error decision circuit 50 is the same circuit as the error decision circuit 48. The error decision circuit 50 determines the type of the error and an error block using the syndrome syn1 [5:0], corrects an error of the read data code1 [21:0], and outputs the correction code ccode1 [21:0], the output data dout1 [15:0], and the error flag signal errflg_2b1.

The error decoding circuit 52 determines which of the error decision circuits 48, 50 is true, depending on the error contents indicated by the comparison result signals res0 and res1, and outputs the output data dout0 [15:0] (or dout1 [15:0]), the error flag signal errflg_2b0 (or errflg_2b1) and the correction code ccode0 [21:0] (or ccode1 [21:0]) output from the determined error decision circuit 48 (or 50) as the output data DOUT [15:0], the ECC error signal ECCERR, and the correction code ccode [21:0]. The output data DOUT [15:0] and the ECC error signal ECCERR are output to the outside of the pseudo SRAM through the data terminals DQ15-0 and the error terminal ECCERR. The correction code ccode [21:0], which is not used in the present embodiment, is rewrite data used when data of the error generated memory cell is rewritten.

The encoding circuit 54A of the data encoding part 12e generates the error correction codes wdata [21:16] from the input data DIN [15:0] (write data), and outputs the error correction codes wdata [21:16] to the memory core 24A, along with the write data wdat [15:0].

FIGS. 14 to 17 show an RTL description and a logical synthesized result of a circuit block of a part of the data control circuit 12A shown in FIG. 13. A "syndrome" in the technology corresponds to a "syn" illustrated in FIG. 13.

Figure 15:
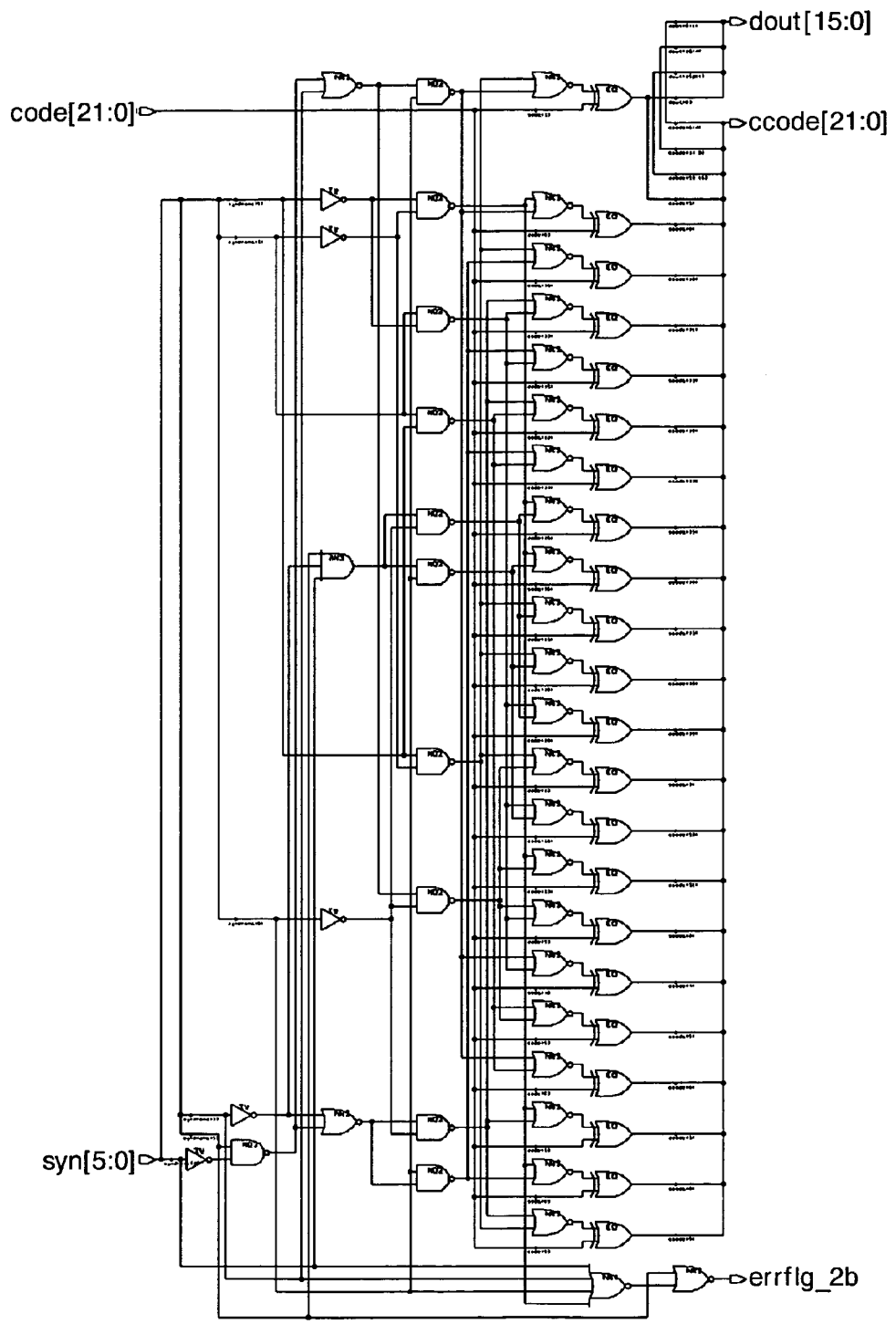
FIG. 15 is a circuit diagram of a result logically synthesized from the RTL description of FIG. 14.

FIG. 14 shows an RTL description of the error decision circuits 48 and 50 shown in FIG. 13. FIG. 15 shows a logical synthesized result from the RTL description of FIG. 14. FIG. 16 shows an RTL description of a syndrome generation unit of the syndrome generation circuits 44 and 46 shown in FIG. 13. FIG. 17 shows an RTL description of the encoding circuit 54A of the data encoding part 12e shown in FIG. 13.

FIG. 18 shows an error correction operation of the data control circuit 12A shown in FIG. 12.

In the drawing, blocks D0-D15 and blocks P0-P5 correspond to the data blocks MBD0-15 and the code blocks MBE16-21, respectively, shown in FIG. 12. For bit addresses E1-E22 of the blocks D0-D15 and P0-P5, syndrome bits are allocated to the error addresses, as shown in FIG. 18, in the same manner as a typical Hamming code.

In this example, the data block MBD10 (block D10) operates as the refresh block. For this reason, a bit corresponding to the block D10 out of the read data rdat is not uniform so as to be surrounded by a large shaded frame. The data additional circuit 42 of the data control circuit 12A shown in FIG. 13 generates read data code0 that "logic 0" is added to the bit corresponding to the block D10, and read data code 1 that "logic 1" is added to the bit corresponding to the block D10.

The syndrome generation circuit 44 generates a syndrome syn0 [5:0] from the read data code0. All bits S5-0 of the syndrom syn0 [5:0] are "logic 0", so that the syndrome generation circuit 44 outputs the comparison result signal res0 ("1000") indicating no error. The syndrome generation circuit 46 generates a syndrome syn1 [5:0] from the read data code1. The most significant bit S5 of the syndrome syn1 [5:0] is "logic 1", the syndrome generation circuit 46 outputs the comparison result signal res1 ("0010") indicating a single-bit error.

The syndrome syn0 [5:0] from the syndrome generation circuit 44 indicates no error, so that the error decision circuit 48 outputs the bit corresponding to the data blocks MBD15-0 of the read data code0 [21:0] as output data dout0 [15:0]. The syndrome syn1 [5:0] from the syndrome generation circuit 44 indicates a single-bit error, so that the error decision circuit 50 takes the lower 5 bits ("01111"="15" in decimal number) of the syndrome syn1 [5:0] as an error address ("E15"=MBD10). The error decision circuit 50 inverts the logic of the data read from the data block MBD10 of the read data code1 [21:0], and outputs the bit corresponding to the data blocks MBD15-0 as output data dout1 [15:0].

The error decoding circuit 52 determines that the output of the error decision circuit 48 is correct by the comparison result signals res0 (no error) and res1 (single-bit error) from the syndrome generation circuits 44 and 46. The error decoding circuit 52 outputs the output data dout [15:0] and the error flag signal errflg_2b0 (indicating no error) output from the error decision circuit 48 as the output data DOUT [15:0] and the ECC error signal ECCERR (indicating no error).

Figure 19:
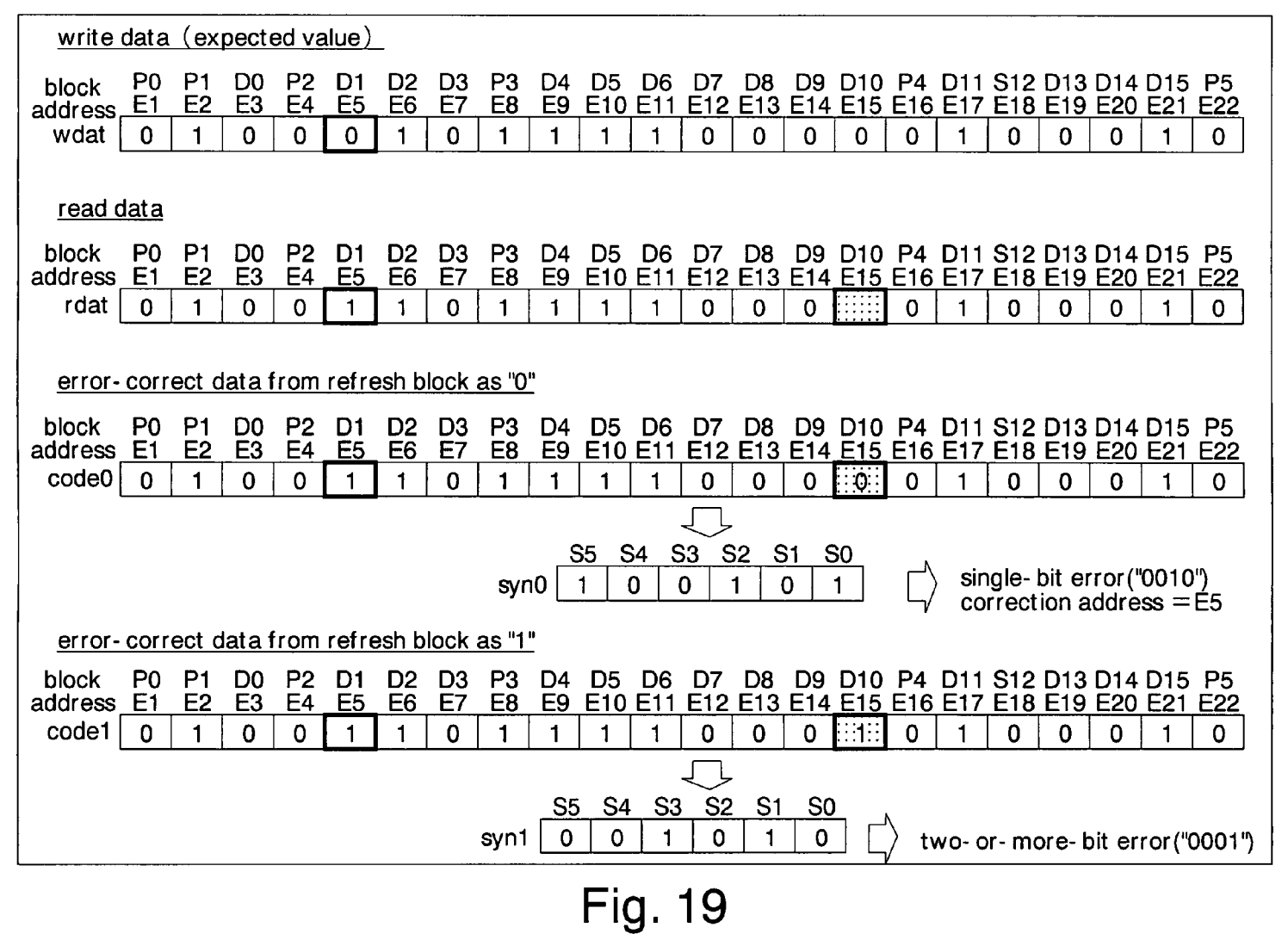

FIG. 19 shows another error correction operation of the data control circuit 12A shown in FIG. 12. A detailed description on technologies and operations identical to FIG. 18 will be omitted.

In this example, in the same manner as in FIG. 18, the data block MBD10 (block D10) operates as the refresh block. In addition, in the drawing, a single-bit error is generated at the data block MBD1 (block D1), as indicated by a frame.

The data additional circuit 42 of the data control circuit 12A generates read data code0 that "logic 0" is added to the bit corresponding to the block D10, and read data code 1 that "logic 1" is added to the bit corresponding to the block D10.

The syndrome generation circuits 44 and 46 generate the syndromes syn0 [5:0] and syn1 [5:0] from the read data code0 and code1, respectively. The most significant bit S5 of the syndrom syn0 [5:0] is "logic 1", so that the syndrome generation circuit 44 outputs the comparison result signal res0 ("0010") indicating a single-bit error. The most significant bit S5 of the syndrome syn1 [5:0] is "logic 0" and at least one of the bits S4-0 is "logic 1", so that the syndrome generation circuit 46 outputs the comparison result signal res1 ("0001") indicating two-or-more-bit error.

The syndrome syn0 [5:0] from the syndrome generation circuit 44 indicates a single-bit error, so that the error determination circuit 48 takes the lower 5 bits ("00101"="5" in decimal number) of the syndrome syn0 [5:0] as an error address ("E5"=MBD1). The error decision circuit 48 inverts "logic 1" read from the data block MBD1, and outputs the bits corresponding to the data blocks MBD15-0 of the read data code0 [21:0] as output data dout0 [15:0]. The syndrome syn1 [5:0] from the syndrome generation circuit 44 indicates two-or-more-bit error, so that the error decision circuit 50 outputs the bits corresponding to the data blocks MBD15-0 of the read data code1 [21:0] as it is, as output data dout1 [15:0] without performing the error correction. In addition, the error decision circuit 50 activates the error flag signal errflg_2b1 up to a high level.

The error decoding circuit 52 determines that the output of the error decision circuit 48 is correct by the comparison result signals res0 (single-bit error) and res1 (two-or-more-bit error) from the syndrome generation circuits 44 and 46. The error decoding circuit 52 outputs the output data dout0

[15:0] output from the error decision circuit 48 and the error flag signal errflg_2b0 (indicating no error) as output data DOUT [15:0] and an ECC error signal ECCERR (indicating no error).

In the present embodiment as well, the same effect as the above-mentioned first embodiment can be obtained. In addition, according to the present embodiment, the extracted Hamming code is used as code data, so that the number of bits of the code data can be reduced. As a result, the number of code blocks MBE can be reduced by 2 as compared with the first embodiment, and a chip size of the pseudo SRAM can be reduced.

In addition, when the error correction circuit 12f detects "two-or-more-bit error" that cannot be corrected, the error correction circuit 12f outputs the ECC error signal ECCERR. With the ECC error signal ECCERR, the external system that accesses the pseudo SRAM can perform an operation so as to avoid errors, such as retrying the read operation and deleting data. As a result, the reliability of the system can be improved.

Figure 20:
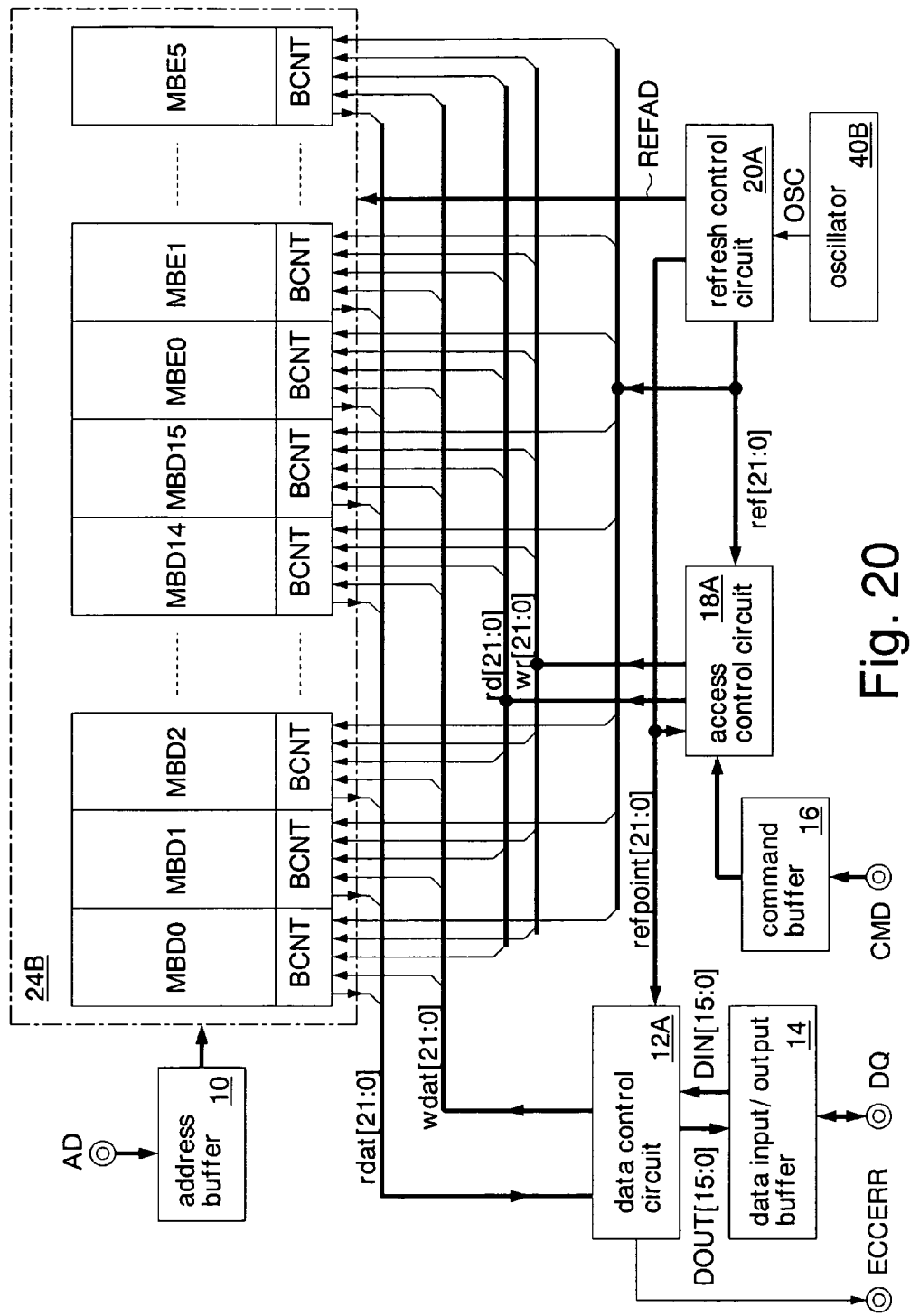
FIG. 20 is a block diagram of a semiconductor memory according to a third embodiment of the invention.

FIG. 20 shows a semiconductor memory according to the third embodiment of the invention. Like numerals are given to circuits and signals identical to the circuits and signals illustrated in the first and second embodiments, and a detailed description thereof will be omitted.

The semiconductor memory of the present embodiment is formed on the silicon substrate as a clock asynchronous type pseudo SRAM using a CMOS process. In addition, according to the present embodiment, the extracted Hamming code is used as an error correction code. The minimum Hamming distance of the extracted Hamming code is "4", and correction of the single bit error and detection of the double bit error can be provided at the same time.

The pseudo SRAM has a memory core 24B and an oscillator 40B, instead of the memory core 24A and the oscillator 40A of the second embodiment. The remaining arrangement is almost the same as that of second embodiment.

The memory core 24B is identical to the memory core 24A of the second embodiment, except that a row redundancy circuit that eliminates defects in a word line and a column redundancy circuit that eliminates defects in a bit line are formed.

The oscillator 40B self-oscillates a clock signal OSC having a shorter period than in the second embodiment. For this reason, an activation interval of each refresh point signal refpoint [21:0] output by the refresh control circuit 20A and a generation interval of the refresh request signal ref [21:0] are shorter than those in the second embodiment. Specifically, the activation interval T1 of each refresh point signal refpoint [21:0] (corresponding to the refresh interval of each memory cell) is set to be shorter than the data retention time of the worst memory cell. For this reason, all memory cells including the worst memory cell can always hold data by performing the refresh operation. The error correction function of the data control circuit 12A is used to eliminate defects of the memory core, generated by the fabrication process. In other words, the code blocks MBE0-5 function instead of the row redundancy circuit and the column redundancy circuit.

In the present embodiment as well, the same effect as those in the above-mentioned first and second embodiments can be obtained. In addition, according to the present embodiment, the code blocks MBE0-5 are formed instead of the row redundancy circuit and the column redundancy circuit, so that erroneous data read from the bad memory cell due to the fabrication process can be corrected with the error correction circuit. Since it is not necessary to form a redundancy circuit, the chip size can be reduced.

Figure 21:
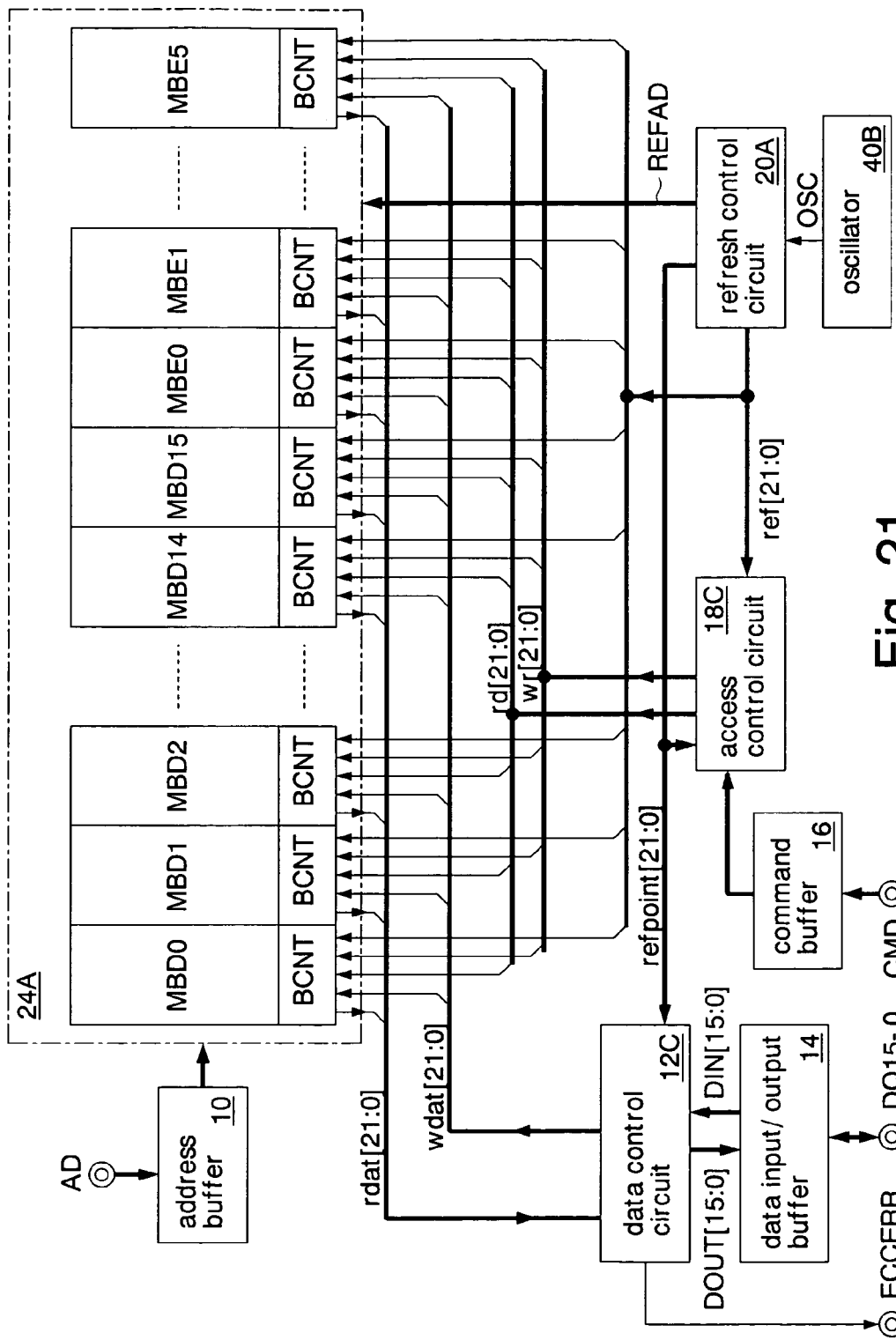
FIG. 21 is a block diagram of a semiconductor memory according to a fourth embodiment of the invention.

FIG. 21 shows a semiconductor memory according to a fourth embodiment of the invention. Like numerals are given to circuits and signals identical to the circuits and signals illustrated in the first and second embodiments, and a detailed description thereof will be omitted.

The semiconductor memory of the present embodiment is formed on a silicon substrate as a clock asynchronous type pseudo SRAM using a CMOS process. In addition, according to the present embodiment, the extracted Hamming code is used as an error correction code. The minimum Hamming distance of the extracted Hamming code is "4", and correction of single bit error and detection of double bit error are provided at the same time.

The pseudo SRAM has a data control circuit 12C, an access control circuit 18C, and an oscillator 40B as in the third embodiment, instead of the data control circuit 12A, the access control circuit 18A and the oscillator 40A of the second embodiment.

The data control circuit 12C has a function to rewrite the corrected data to the memory core 24A, when the correctable error (single-bit error) is detected during the read operation. The access control circuit 18C outputs a write request signal wr [21:0], when the data control circuit 12C rewrites the corrected data to the memory core 24A.

Figure 22:
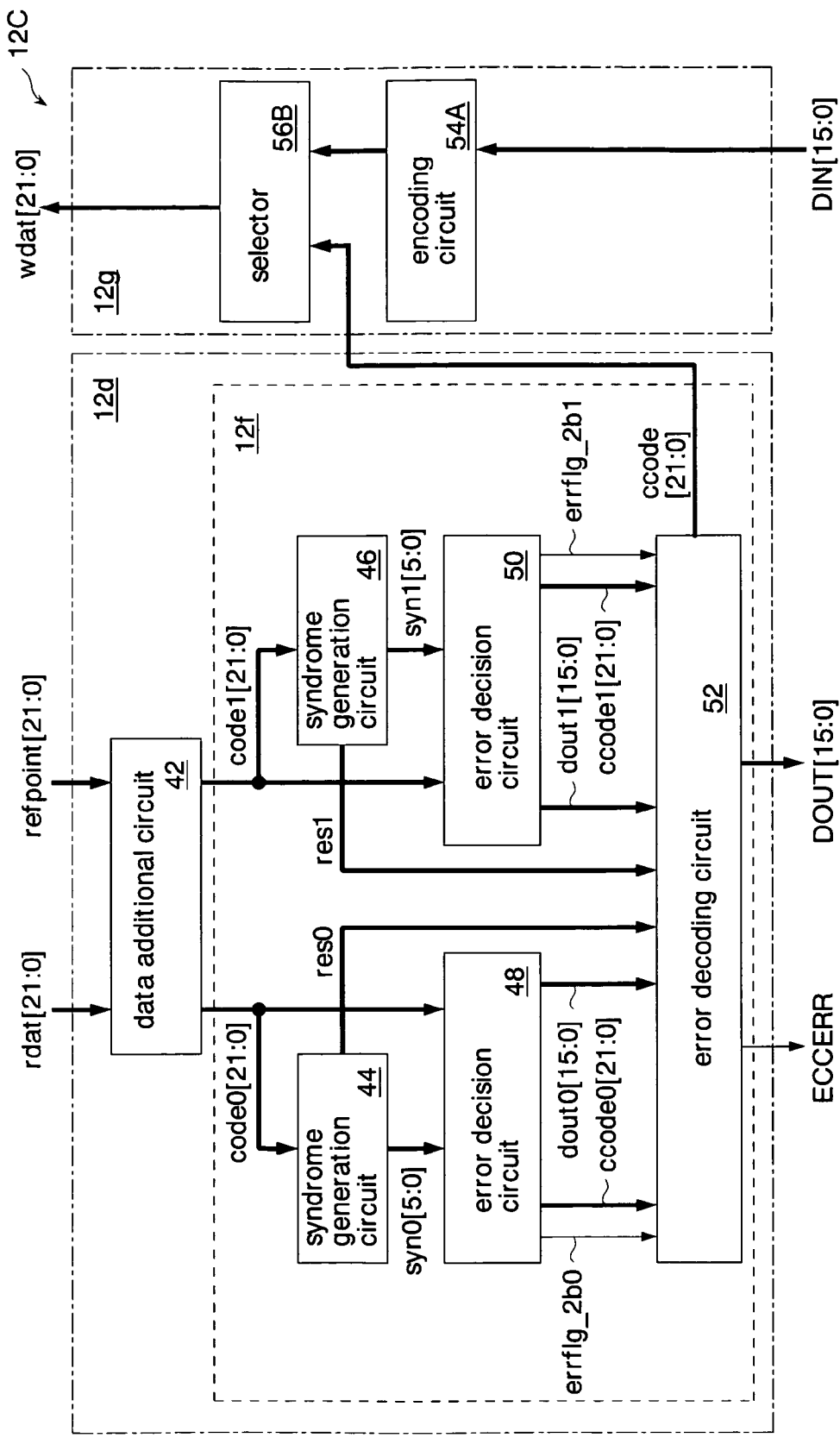
FIG. 22 is a detailed block diagram of a data control circuit shown in FIG. 21.

FIG. 22 shows a detailed data control circuit 12C shown in FIG. 21.

The data control circuit 12C has a data encoding part 12g instead of the data encoding part 12e of the second embodiment. An arrangement of the data correction part 12d is identical to that of the second embodiment. The data encoding part 12g has an encoding circuit 54A and a selector 56B. The selector 56B outputs data, which is encoded the input data DIN [15:0] (write data) by the encoding circuit 54A, as the write data wdat [21:0]. In addition, when a single-bit error is generated during the read operation, the selector 56B outputs the correction code ccode [21:0] from the error decoding circuit 52 of the data correction unit 12d to output as the write data wdat [21:0]. In other words, the selector 56B serves as a rewrite control circuit to rewrite the data corrected by the error correction circuit 12f to the data blocks MBD and the code blocks MBE, during the read operation.

In the present embodiment as well, the same effect as the above-mentioned first and second embodiments can be obtained. In addition, according to the present embodiment, the data corrected by the error correction circuit 12f can be rewritten to the data blocks MBD and the code blocks MBE by the selector 56B. For this reason, when data in the memory cell corrupted by power noise and soft error is read out, correct data can be written to the memory cell, so that reliability of the pseudo SRAM can be enhanced.

Figure 23:
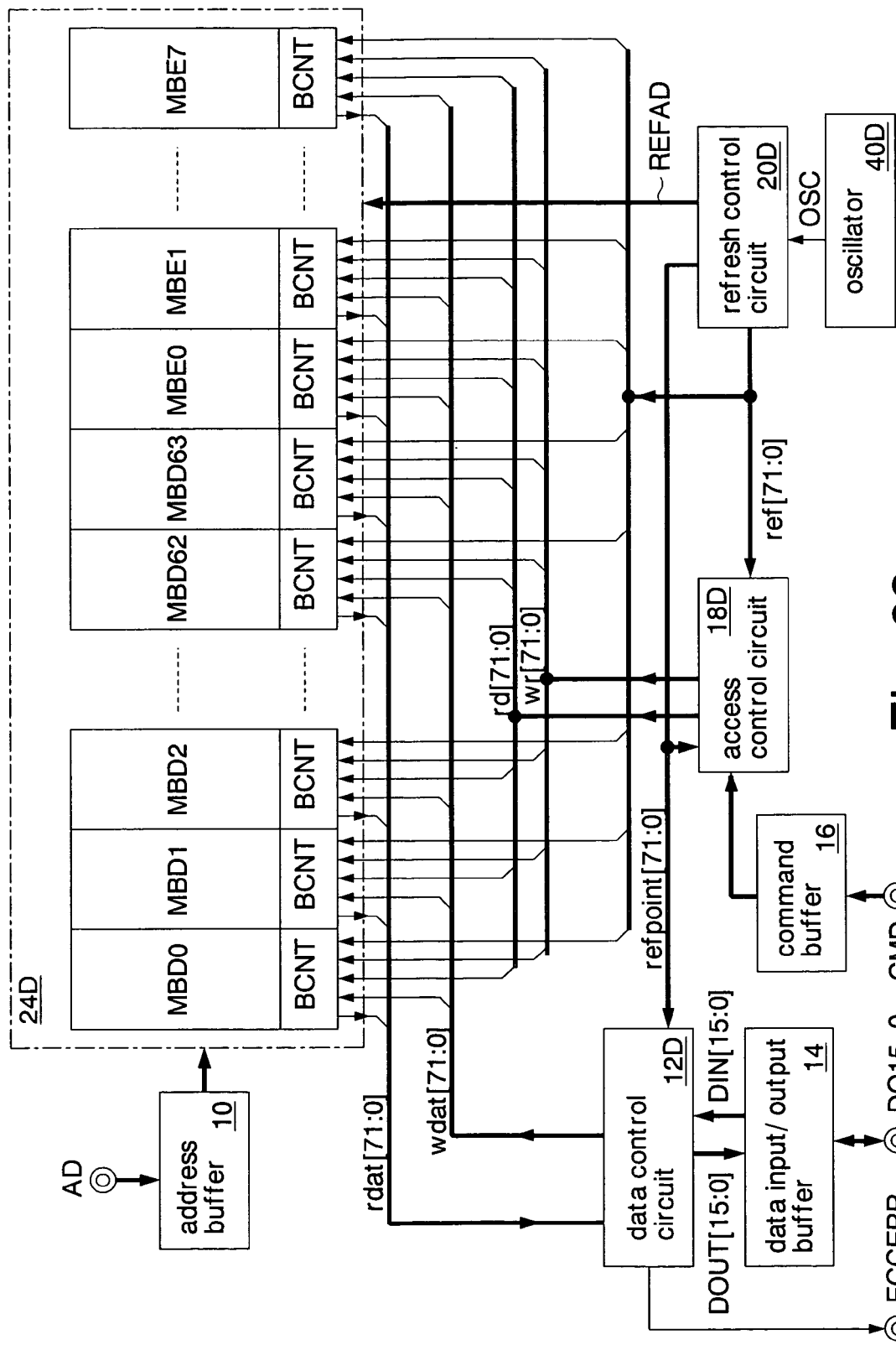
FIG. 23 is a block diagram of a semiconductor memory according to a fifth embodiment of the invention.

FIG. 23 shows a semiconductor memory according to a fifth embodiment of the invention. Like numerals are given to circuits and signals identical to the circuits and signals illustrated in the first and second embodiments, and a detailed description thereof will be omitted.

The semiconductor memory of the present embodiment is formed on a silicon substrate as a clock asynchronous type pseudo SRAM using a CMOS process. In addition, according to the present embodiment, the extracted Hamming code is used as an error correction code. The minimum Hamming distance of the extracted Hamming code is "4", and correction of single bit error and detection of double bit error are provided at the same time.

The pseudo SRAM has a data control circuit 12D, an access control circuit 18D, an refresh control circuit 20D, an oscillator 40D and a memory core 24D, instead of the data control circuit 12A, the access control circuit 18A, the refresh control circuit 20A, the oscillator 40A, and the memory core 24A of the second embodiment.

The memory core 24D has sixty-four data blocks MBD [63:0] and eight code blocks MBE [7:0]. According to the present embodiment, the number of data blocks MBD [63:0] is designed to be four times of the number of data terminals DQ [15:0]. For this reason, with only write data supplied to the data terminals [15:0] in one time of write operation, code data cannot be generated. Therefore, it is necessary that the data control circuit 12D be read out from the data blocks MBD [63:0] and the code blocks MBE [7:0], during the beginning of the write operation. However, the number of bits of information data for generating the code data increases, so that the number of coded blocks MBE can be relatively reduced. In particular, in case of the extracted Hamming code, when the information bit is n times of 2, the code data will be good with only n+2 bits. As a result, the relative number of code blocks MBE can be significantly reduced, and the chip size of the pseudo SRAM can be prevented from increasing.

During the read operation, when there is an error (single-bit error) that can be corrected in the read data rdat [71:0] during the read operation, the data control circuit 12D corrects the error. Further, the data control circuit 12D selects read data corresponding to sixteen data blocks out of data blocks MBD0-63, depending on the lower bits of the row address supplied to the address terminal AD, and outputs the selected data as output data DOUT [15:0]. During the read operation, when the error (two-or-more-bit error) that cannot be corrected is in the read data rdat [71:0], the data control circuit 12D outputs the ECC error signal ECCERR to the ECC terminal.

During the write operation, the data control circuit 12D reads data from the data blocks MBD0-63 and the code blocks MBE0-7, and decodes information data when there is an error. Next, the data control circuit 12D changes the bit corresponding to the write data DIN [15:0] out of the decoded information data into the write data DIN [15:0] to thus generate a rewrite data string. Further, the data control circuit 12D determines new code data from the rewrite data string, and writes the rewrite data string and new code data into the data blocks MBD0-63 and the code blocks MBE0-7, respectively. Like this, according to the present embodiment, the pseudo SRAM performs the read operation to read data from the memory core 24A, during the beginning of the write operation.

The access control circuit 18D is matched to an operation of the data control circuit 12D, and outputs the read request signals rd [71:0] and the write request signals wr [71:0]. Specifically, during the write operation, the read request signals rd [71:0] and the write request signals wr [71:0] are sequentially output.

The refresh control circuit 20D sequentially outputs the refresh point signals refpoint [71:0] and the refresh request signals ref [71:0]. An operation of the refresh control circuit 20D is identical to that of the refresh control circuit 20A of the second embodiment, except that the number of bits of the output signals increases. A frequency of the clock signal OSC output by the oscillator 40D corresponds to the number of bits of the refresh point signals refpoint [71:0], and is set to be higher than that in the second embodiment.

Figure 24:
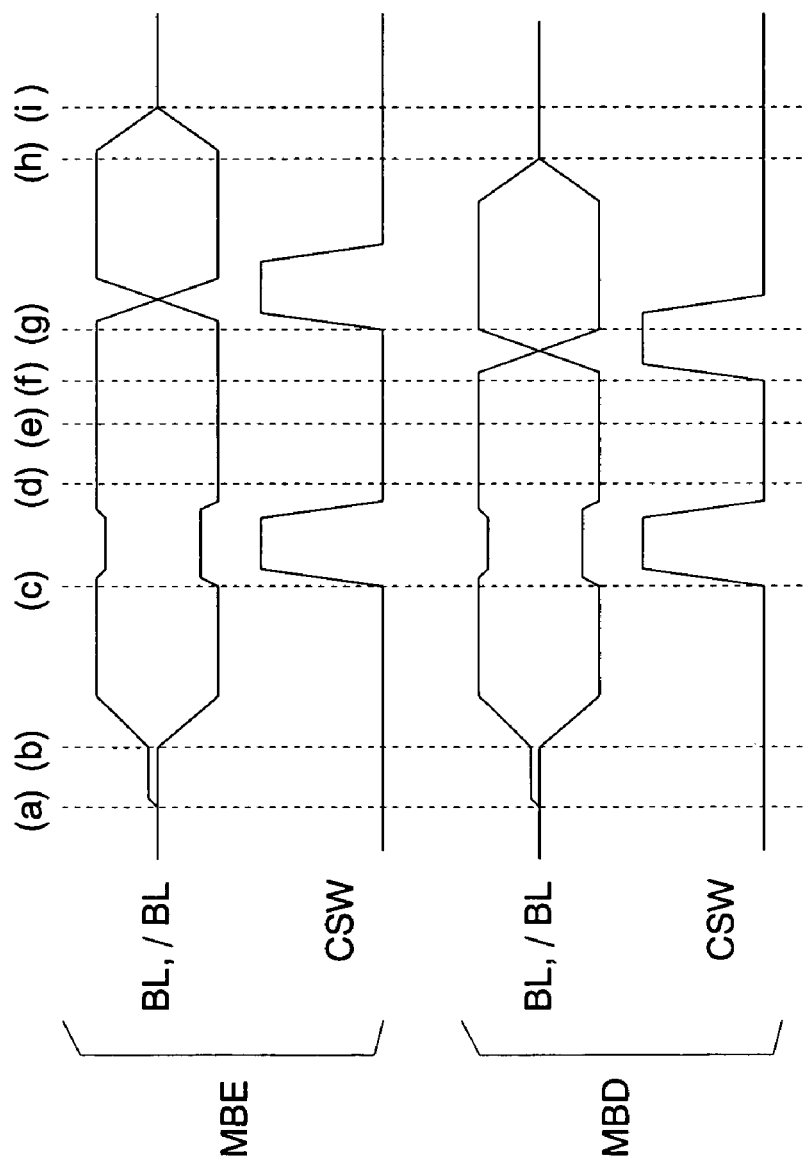
FIG. 24 is a timing diagram of a write operation of a pseudo SRAM shown in FIG. 23.

FIG. 24 shows the write operation of the pseudo SRAM shown in FIG. 23.

During the write operation, first, the word line not shown is activated, so that in each of the code blocks MBE and the data blocks MBD, data is read from the memory cell to any one of the complementary bit lines BL and /BL ((a) in FIG. 24). Next, the sense amplifier is activated, and a voltage difference between the bits lines BL and /BL is amplified ((b) in FIG. 24). Next, the column switch signal CSW is activated, and amplified data is transmitted to the data control circuit 12D as the read data rdat [63:0] ((c) in FIG. 24). The data control circuit 12D corrects an error of the read data rdat [63:0]. Next, the data control circuit 12D switches eight bits of data read from the data blocks MBD into the write data DIN [7:0] supplied to the data terminals DQ7-0 ((d) in FIG. 24).

Next, the data control circuit 12D generates new code data using the switched write data ((e) in FIG. 24). Further, the switched write data and the new code data are sequentially written to the code blocks MBE and the data blocks MBD, as the write data wdat [63:0] ((f) and (g) in FIG. 24). And then, the word line is inactivated, bit lines BL and /BL are precharged, and thus the write operation is completed ((h) and (i) in FIG. 24).

In this example, a timing of the column switch signal csw in writing data, an inactivation timing of the word line, and a precharge start timing of bit lines BL and /BL are different in the code block MBE and the data block MBD. However, these timings may be the same for the code block MBE and the data block MBD.

In the present embodiment as well, the same effect as in the above-mentioned first and second embodiments can be obtained. In addition, according to the invention, the number of data blocks for storing the information data increases, so that the number of bits of code data can be reduced relative to the number of bits of information data. As a result, the number of code blocks can be reduced relative to the number of data blocks, and the chip size of the pseudo SRAM can be reduced.

In addition, the above-mentioned embodiments have been described in the context that the invention is applied to the pseudo SRAM chip. However, an embodiment to which the present invention is applied is not limited hereto. For example, the invention may also be applied to a pseudo SRAM core embedded in the system LSI.

The invention is not limited to the above embodiments and various modifications may be made without departing from the spirit and scope of the invention. Any improvement may be made in part or all of the components.

What is claimed is:

1. A semiconductor memory comprising:
a plurality of data blocks having memory cells which store information data;
a plurality of code blocks having memory cells which store code data to decode data stored in said data blocks;
a refresh control circuit which outputs refresh request signals to sequentially perform refresh operations on said data blocks and said code blocks;
a data additional circuit which adds a plurality of types of expectation data to be read out from a refresh block to data read out from other blocks, respectively, to thus generate a plurality of read data strings, the refresh block not being read out by the refresh operation of said data blocks and said code blocks; and
an error correction circuit which detects errors for said read data strings, sets the most reliable result of the error detection results to be true, and corrects an error of one of the read data strings corresponding to the true error detection result.

2. The semiconductor memory according to claim 1, wherein said refresh control circuit sequentially outputs the refresh request signals to said data blocks and said code blocks so as to perform the refresh operations on any of said data blocks and said code blocks.

3. The semiconductor memory according to claim 1, further comprising:
an access control circuit which outputs a read request signal to read said data blocks and said code blocks other than the refresh block, in response to a read command.

4. The semiconductor memory according to claim 1, further comprising:
an access control circuit which outputs a write request signal to write to said data blocks and said code blocks, in response to a write command,
wherein said data blocks and said code blocks each include a block control circuit which performs the refresh operation and then performs a write operation when said refresh request signals and said write request signal conflict with each other.

5. The semiconductor memory according to claim 4, wherein an external write cycle time that is a minimum supply interval of the write command is set to be longer than an internal write cycle time that is a write operation time of said each block.

6. The semiconductor memory according to claim 5, wherein, during a switching period which is a period to switch from a final refresh request signal of one refresh block to the next refresh block, n times of said external write cycle time can be inserted, and one refresh operation and n times of the write operation can be performed.

7. The semiconductor memory according to claim 6, wherein said switching period is set to be at least (Tcyc/δ)×Tcyc, when δ is a difference between the external write cycle time Tcyc and the internal write cycle time.

8. The semiconductor memory according to claim 1, wherein said code blocks are formed instead of a redundancy circuit that eliminates defects.

9. The semiconductor memory according to claim 8, wherein said code blocks are formed instead of a row redundancy circuit that eliminates defects in a word line unit.

10. The semiconductor memory according to claim 8, wherein said code blocks are formed instead of a column redundancy circuit that eliminates defects in a bit line unit.

11. The semiconductor memory according to claim 1, wherein said data additional circuit generates two read data strings assuming that logics of the read data from the refresh block are logic 1 and logic 0.

12. The semiconductor memory according to claim 11, wherein said error correction circuit selects as true a read data string having a least error between said read data strings.

13. The semiconductor memory according to claim 12, wherein said error correction circuit detects one of "no error", "single-bit error in some data block", "code error which is a single-bit error in a code block", and "two-or-more-bit error", prioritizes the error decision of no error>code error>single-bit error>two-or-more-bit error, and sets an item having a higher priority to be true.

14. The semiconductor memory according to claim 13, further comprising:
an error terminal that outputs an error signal when said error correction circuit detects "two-or-more-bit error".

15. The semiconductor memory according to claim 12, wherein said error correction circuit detects one of "no error", "single-bit error in any of data block and code block", and "two-or-more-bit error", prioritizes the error decision of no error>single-bit error>two-or-more-bit error, and sets an item having a higher priority to be true.

16. The semiconductor memory according to claim 1, further comprising:
an error terminal that outputs an error signal when said error correction circuit detects an error that cannot be corrected.

17. The semiconductor memory according to claim 1, further comprising:
a rewrite control circuit which rewrites data corrected by said error correction circuit in said data blocks and said code blocks.

18. The semiconductor memory according to claim 1, further comprising:
a plurality of data terminals which input and output said information data, wherein
said data blocks are formed corresponding to said data terminals, respectively.

19. The semiconductor memory according to claim 1, further comprising:
a plurality of data terminals which input and output said information data, wherein
the write data supplied to said data terminals at once is written to a part of said data blocks, and
said error correction circuit, during the write operation, decodes said information data by data from said data blocks and said code blocks, generates a rewrite data string by replacing a part of decoded information data with said write data, determines new code data from said rewrite data string, and writes said rewrite data string and said new code data into said data blocks and said code blocks.

20. The semiconductor memory according to claim 1, wherein a refresh interval of each memory cell is set to be longer than a data retention time of a worst memory cell.

21. The semiconductor memory according to claim 1, wherein said error correction circuit includes:
a first encoding circuit which generates a first code data from an information data string to which expectation data of logic 0 is added;
a second encoding circuit which generates a second code data from an information data string to which expectation data of logic 1 is added;
a first error decision circuit which judges an error by comparing said first code data with code data read from said code blocks;
a second error decision circuit which judges an error by comparing said second code data with code data read from said code blocks; and
an error decoding circuit which corrects an error based on the true decision result, assuming the most reliable decision result of said first and second error decision circuits to be true.

22. The semiconductor memory according to claim 1, wherein said error correction circuit includes:
an encoding circuit which generates code data from an information data string read from said data blocks;

a first error decision circuit which compares the generated code data with a code data string to which expectation data of logic 0 is added, to thus determine an error;

a second error decision circuit which compares the generated code data with a code data string to which expectation data of logic 1 is added, to thus determine an error; and an error decoding circuit which corrects an error based on the true decision result, assuming the most reliable decision result of said first and second error decision circuits to be true.

23. The semiconductor memory according to claim 1, wherein said error correction circuit includes:

a first syndrome generation circuit which generates a first syndrome from a read data string to which expectation data of logic 0 is added;

a second syndrome generation circuit which generates a second syndrome from a read data string to which expectation data of logic 1 is added;

a first error decision circuit which detects whether or not there is an error and detects an error address using said first syndrome;

a second error decision circuit which detects whether or not there is an error and detects an error address using said second syndrome; and an error decoding circuit which corrects an error based on the true decision result, assuming the most reliable decision result of said first and second error decision circuits to be true.

24. The semiconductor memory according to claim 1, wherein a minimum Hamming distance of said code data is four or more.

25. The semiconductor memory according to claim 24, wherein said code data is a horizontal/vertical parity code.

26. The semiconductor memory according to claim 24, wherein said code data is an extracted Hamming code.

27. A method of operating a semiconductor memory having a plurality of data blocks with memory cells which store information data, a plurality of code blocks with memory cells that store code data to decode data stored in said data blocks, and a refresh control circuit which outputs refresh request signals to sequentially perform refresh operations on said data blocks and said code blocks, the method comprising the steps of:

generating a plurality of read data strings by adding a plurality of types of expectation data to be read out from a refresh block to data read out from other blocks, respectively, the refresh block being a block, of said data blocks and said code blocks, unable to be read out by the refresh operation;

detecting errors for said read data strings and setting the most reliable result of the error detection results to be true; and correcting an error of one of the read data strings corresponding to the error detection result held to be true.

28. The method of operating the semiconductor memory according to claim 27, further comprising the step of:

sequentially outputting the refresh request signals to said data blocks and said code blocks so as to perform the refresh operations on any of said data blocks and said code blocks.

29. The method of operating the semiconductor memory according to claim 27, further comprising the step of:

outputting a read request signal to read said data blocks and said code blocks other than the refresh block, in response to a read command.

30. The method of operating the semiconductor memory according to claim 27, further comprising the step of:

outputting a write request signal to write to said data blocks and said code blocks, in response to a write command, wherein said data blocks and said code blocks each performs the refresh operation and then performs a write operation when said refresh request signals and said write request signal conflict with each other.

31. The method of operating the semiconductor memory according to claim 30, wherein an external write cycle time that is a minimum supply interval of the write command is set to be longer than an internal write cycle time that is a write operation time of said each block.

32. The method of operating the semiconductor memory according to claim 31, wherein, during a switching period which is a period to switch from a final refresh request signal of one refresh block to the next refresh block, n times of said external write cycle time can be inserted, and one refresh operation and n times of the write operation can be performed.

33. The method of operating the semiconductor memory according to claim 32, wherein said switching period is set to be at least (Tcyc/δ)×Tcyc, when δ is a difference between the external write cycle time Tcyc and the internal write cycle time.

34. The method of operating the semiconductor memory according to claim 27, further comprising the step of:

generating two read data strings assuming that logics of the read data from the refresh block are logic 1 and logic 0.

35. The method of operating the semiconductor memory according to claim 34, further comprising the step of:

selecting as true a read data string having a least error between said read data strings.

36. The method of operating the semiconductor memory according to claim 35, further comprising the steps of:

detecting one of "no error", "single-bit error in some data block", "code error which is a single-bit error in a code block", and "two-or-more-bit error";

prioritizing the error decision of no error>code error>single-bit error>two-or-more-bit error; and setting an item having a higher priority to be true.

37. The method of operating the semiconductor memory according to claim 36, further comprising the step of:

outputting an error signal when said error correction circuit detects the "two-or-more-bit error".

38. The method of operating the semiconductor memory according to claim 35, further comprising the step of:

detecting one of "no error", "single-bit error in any of data block and code block", and "two-or-more-bit error";

prioritizing the error decision of no error>single-bit error>two-or-more-bit error; and setting an item having a higher priority to be true.

39. The method of operating the semiconductor memory according to claim 27, further comprising the step of:

outputting an error signal when said error correction circuit detects an error that cannot be corrected.

40. The method of operating the semiconductor memory according to claim 27, further comprising the step of:

rewriting data corrected by said error correction circuit in said data blocks and said code blocks.

41. The method of operating the semiconductor memory according to claim 27, further comprising the steps of:
   decoding said information data by data of said data blocks and said code blocks;
   generating a rewrite data string by replacing a part of the decoded information data with write data;
   determining new code data from said rewrite data string; and
   writing to a part of said data blocks the write data supplied at once to data terminals which input/output the information data by writing said rewrite data string and said new code data into said data blocks and said code blocks, respectively,
   the steps occurring during a write operation.

42. The method of operating the semiconductor memory according to claim 27,
   wherein a refresh interval of each memory cell is set to be longer than a data retention time of a worst memory cell.

43. The method of operating the semiconductor memory according to claim 27, further comprising the steps of:
   generating a first code data from an information data string to which expectation data of logic 0 is added;
   generating a second code data from an information data string to which expectation data of logic 1 is added;
   judging an error by comparing said first code data with code data read from said code blocks;
   judging an error by comparing said second code data with code data read from said code blocks; and
   correcting an error based on the true decision result, assuming the most reliable decision result of said first and second error decision circuits to be true.

44. The method of operating the semiconductor memory according to claim 27, further comprising the steps of:
   generating code data from an information data string read from said data blocks;
   comparing the generated code data with a code data string to which expectation data of logic 0 is added, to thus determine an error;
   comparing the generated code data with a code data string to which expectation data of logic 1 is added, to thus determine an error; and
   correcting an error based on the true decision result, assuming the most reliable decision result of said first and second error decision circuits to be true.

45. The method of operating the semiconductor memory according to claim 27, further comprising the steps of:
   generating a first syndrome from a read data string to which expectation data of logic 0 is added;
   generating a second syndrome from a read data string to which expectation data of logic 1 is added;
   detecting whether or not there is an error and detects an error address using said first syndrome;
   detecting whether or not there is an error and detects an error address using said second syndrome; and
   correcting an error based on the true decision result, assuming the most reliable decision result of said first and second error decision circuits to be true.

46. The method of operating the semiconductor memory according to claim 27,
   wherein a minimum Hamming distance of said code data is four or more.

47. The method of operation the semiconductor memory according to claim 46,
   wherein said code data is a horizontal/vertical parity code.

48. The method of operating the semiconductor memory according to claim 46,
   wherein said code data is an extracted Hamming code.

* * * * *